United States Patent [19]
Watanabe et al.

[11] Patent Number: 6,091,659
[45] Date of Patent: Jul. 18, 2000

[54] SYNCHRONOUS SEMICONDUCTOR MEMORY DEVICE WITH MULTI-BANK CONFIGURATION

[75] Inventors: Naoya Watanabe; Katsumi Dosaka, both of Hyogo, Japan

[73] Assignee: Mitsubishi Denki Kabushiki Kaisha, Tokyo, Japan

[21] Appl. No.: 09/318,433

[22] Filed: May 25, 1999

Related U.S. Application Data

[62] Division of application No. 08/798,953, Feb. 11, 1997, Pat. No. 5,956,285.

[30] Foreign Application Priority Data

Apr. 22, 1996 [JP] Japan .................................. 8-100122

[51] Int. Cl.⁷ .................................................. G11C 8/00
[52] U.S. Cl. .............................. 365/230.03; 365/230.08
[58] Field of Search ........................ 365/230.03, 230.06, 365/230.08

[56] References Cited

U.S. PATENT DOCUMENTS

| | | | |
|---|---|---|---|
| 5,126,973 | 6/1992 | Gallia et al. | 365/200 |
| 5,384,745 | 1/1995 | Konishi et al. | 365/230.03 |
| 5,483,497 | 1/1996 | Mochizuki et al. | 365/230.03 |
| 5,621,693 | 4/1997 | Nakase | 365/227 |
| 5,835,436 | 11/1998 | Ooishi | 365/230.03 |

FOREIGN PATENT DOCUMENTS

| | | |
|---|---|---|
| 63225993 | 9/1988 | Japan . |
| 6-243674 | 9/1994 | Japan . |
| 06318391 | 11/1994 | Japan . |
| 08096571 | 4/1996 | Japan . |

*Primary Examiner*—A. Zarabian
*Attorney, Agent, or Firm*—McDermott, Will & Emery

[57] ABSTRACT

Memory blocks provided to share a sense amplifier band, a global IO (GIOB) bus provided in common to the memory blocks for transferring internal data, and local IO bus lines provided corresponding to the memory blocks are connection-controlled based on signals related to a column select operation. Driving memory blocks independently from each other permits each memory block to be used as a bank, and if one memory block is accessed during activation of another memory block, data can be prevented from colliding on the global IO bus. A main memory with high page hit rate is implemented using a semiconductor memory device with a shared-sense amplifier configuration. When a memory block sharing a sense amplifier coupled to another memory block is addressed, the another memory block is inactivated and then addressed memory block is accessed, when a valid data is output, such valid data outputting is signaled by a data valid signal.

9 Claims, 18 Drawing Sheets

SYNCHRONOUS SEMICONDUCTOR MEMORY DEVICE WITH MULTI-BANK CONFIGURATION

This application is a divisional of application Ser. No. 08/798,953 filed Feb. 11, 1997, Pat. No. 5,956,285.

BACKGROUND OF THE INVENTION

1. Field of the Invention

The present invention relates generally to semiconductor memory devices, particularly to clock-synchronous semiconductor memory devices inputting/outputting data in synchronization with a clock signal, and more particularly to a multi-bank semiconductor memory device having a plurality of banks inside.

2. Description of the Background Art

In recent years, microprocessors (MPUs) has come to have multiple functions, which enables high speed processing of a bulk of data. Accordingly, a Dynamic Random Access Memory (hereinafter referred to as DRAM) for use as main memory, has come to have an increased memory capacity as the miniaturizing techniques have been developed. The operation speed of the DRAM, however, cannot catch up with the operation speed of the MPU and the performance of the entire processing system is degraded with the bottleneck due to the time required for accessing the DRAM and the cycle time of DRAM. In order to prevent the performance of the processing system from being degraded, a high speed memory called cache memory, normally formed of a Static Random Access Memory (SRAM), is installed between a DRAM and an MPU. Data/instruction frequently used by the MPU are stored in the cache memory and such data/instruction are transferred between the MPU and the cache memory. Only when an instruction/data requested of accessing by the MPU is not present in the cache memory, the DRAM is accessed. It is highly probable that instructions/data required by the MPU are previously stored in the cache memory, and therefore the frequency of accessing the DRAM can be greatly reduced, thereby preventing the operation speed of the processing system from being lowered.

Since the SRAM for use in the cache memory is more expensive than the DRAM, the configuration having such a cache memory installed is not suitable for relatively inexpensive devices such as personal computers. There is therefore a demand for improving the performance of processing system using inexpensive DRAMs. One solution to this is a synchronous DRAM (hereinafter referred to as SDRAM) which is adapted to transfer data in synchronization with a clock signal such as system clock.

In the SDRAM, an operation mode instruction signal is applied in a command form (a combination of the states of a plurality of control signals) in synchronization with a clock signal. In the SRAM, according to this command, a plurality of bits (such as 8 bits per one IO) are selected at a time and these simultaneously selected bits are sequentially output in synchronization with the clock signal. At the time of data writing, data for writing is sequentially taken and written in a prescribed sequence into memory cells simultaneously selected in synchronization with a clock signal.

In the SDRAM, in synchronization with a rising edge of a clock signal, externally applied control signals forming a command, in other words a row address strobe signal /RAS, a column address strobe signal /CAS, a write enable signal /WE, and an address signal and data for writing are taken in for executing internal operation. In synchronization with the clock signal, externally applied data is input and data is output. Therefore it is not necessary to secure a margin for a timing for inputting/outputting data, which takes into consideration of skew (offset in timing) of the control signals and address signals. As a result, the timing for initiating internal operation is rendered faster and therefore the cycle time can be reduced, thus permitting accessing at higher speed.

In a processing system such as image processing system the data bits of serial data addresses are sequentially accessed, while in the processing system a plurality of bits at serial memory positions are frequently accessed because of the localization of the process. Therefore, data is input/output in synchronization with a clock signal, the serial accessing time can be the same as that of the clock signal and the average access time can be comparable to that of the SRAM.

In the SDRAM, the concept of multiple banks is further introduced. More specifically, a plurality of banks are provided in the SDRAM. These banks can be activated and inactivated (precharge) almost independently from each other.

In a standard DRAM, a precharge operation must be performed in order to select a new row. DRAM has its internal signal lines dynamically driven, and therefore each signal line has to be maintained at a prescribed potential level at the time of precharging. For precharging, the time called RAS precharging time tRP is usually necessary (since each internal signal line should be returned to a prescribed potential level.) In the standard DRAM, time called RAS-CAS delay time tRCD is necessary. This is because after a row of memory cells have been selected in response to a row address strobe signal /RAS, a column selecting operation must be executed in response to a column address strobe signal /CAS. Column address strobe signal /CAS must be returned to its inactive state at the of the completion of the column selecting operation. In order to select a memory cell on a new page (a row of memory cells), RAS precharge time tRP and RAS-CAS delay time tRCD are necessary, and therefore the cycle time of a standard DRAM is almost twice its accessing time.

However, if a plurality of banks are provided in the SDRAM, and one bank being activated is accessed while another bank is returned to a precharge state (inactive state), that another bank in the precharge state may be accessed without a waiting time period for RAS precharge time tRP. Therefore, alternately or sequentially activating/precharging (inactivating) these banks permits RAS precharge time tRP to be seemingly eliminated, and therefore high speed accessing is allowed. If one bank is accessed as another bank is precharged and activated, data can be written/read out alternately to/from these banks, time loss by RAS precharge time tRP and RAS-CAS delay time tRCD may be eliminated, and therefore data can be written/read at higher speed.

In the above-described conventional SDRAM, a bank is formed using a memory array (memory mat) as a unit. The memory array (memory mat) has a plurality of memory blocks, and in one memory array, each memory block is driven into a selected or inactive state when a corresponding memory array is activated, and the memory blocks in a memory array cannot be activated/inactivated independently from each other. In the conventional SRAM, the number of banks is as few as the number of memory arrays (memory mats) (usually four banks at most). This is because the array structure of a standard DRAM is employed for the array structure of the SDRAM, row/column decoders are installed separately corresponding to each memory array (memory mat), so that these row/column decoders can be driven independently for each memory array (memory mat).

Use of such a conventional SDRAM with a plurality of banks as a main memory for a processing system will be considered. All the banks of the SDRAM are activated at a time, a row (page) of memory cells are maintained in a selected state in each bank. A sense amplifier provided corresponding to each column of memory cells is used as a pseudo cache. If data/instruction requested by the MPU is not stored in the cache memory (at the time of cache miss), it is determined whether or not the data/instruction requested of accessing by the MPU is present in the selected page of the SDRAM (page hit/miss determination). At the time of page hit, the corresponding page is accessed for transferring the block of data/instructions (cache block) to the cache memory, and the data/instruction requested of accessing is transferred to the MPU (for read accessing). Therefore, at page hit, it is requested that the block of the data instructions is selected from the page for reading out, and therefore after elapse of CAS access time ta(CAS) (or CAS latency) the necessary data/instruction may be transferred to cache memory and to the MPU (for read accessing).

Meanwhile, in the case of page miss, the bank storing the data/instruction requested of accessing is once driven into a precharge state (inactive state), then after the page storing data/instruction required is brought into a selected state, the block including the requested data/instruction is transferred to the cache memory. If the page miss occurs, in the SDRAM, the bank should be once precharged and then activated, and the column must be selected from the selected page. The data/instruction requested is transferred to the cache memory after elapse of the total time period of RAS precharge time tRP, RAS-CAS delay time tRCD, and CAS accessing time ta (CAS) (or CAS latency). During the period, the MPU is in a wait state.

Therefore, if the conventional multi-bank SDRAM is used as a main memory with a small number of banks, the number of pages to be in a selected state is small (the same as the number of banks), its page hit rate is small, and penalty at the time of page miss (the wait time for the MPU) is large.

SUMMARY OF THE INVENTION

It is therefore an object of the invention to provide a semiconductor memory device with a new configuration having a plurality of banks with increased page hit rate.

Another object of the present invention is to provide a semiconductor memory device with a plurality of banks capable of accurately inputting/outputting (writing/reading) required data.

Yet another object of the invention is to provide a semiconductor memory device having a plurality of banks, using an array structure similar to a standard DRAM.

A semiconductor memory device according to a first aspect of the invention includes a memory array having a plurality of memory blocks each with a plurality of memory cells arranged in rows and columns, a plurality of local input/output buses provided corresponding to each of these plurality of memory blocks each for transferring data to and from a selected column of a corresponding memory block, a global input/output bus provided in common for the plurality of memory blocks, bank activation circuitry provided corresponding to each of the plurality of memory blocks, selectively activated in response to a first bank address and an operation mode instruction signal for activating a corresponding memory block when activated, a plurality of bank select switches provided between each of the plurality of local input/output buses and the global input/output bus for electrically connecting a corresponding local input/output bus and the global input/output bus when activated, and bank select control circuitry responsive to a column select operation instruction signal and a bank address signal applied simultaneously with the column select operation instruction signal for activating the bank select switch of a local input/output bus provided corresponding to a memory block specified by the simultaneously applied bank address signal.

A semiconductor memory device according to a second aspect includes a memory array having a plurality of memory blocks having a plurality of memory cells arranged in rows and columns and aligned along the direction of columns, a plurality of sense amplifier bands provided between adjacent memory blocks in the memory array for sensing and amplifying data in a memory cell on a column of a corresponding memory block when activated, a plurality of block isolation/connection circuitry provided between each memory block and each of the plurality of sense amplifier bands for connecting each column of a corresponding memory block to a corresponding sense amplifier band when activated, isolation/connection control circuitry for inactivating the block isolation/connection circuitry provided to a memory block sharing a sense amplifier band with a memory block addressed in response to a bank address signal, and sense activation control circuitry provided corresponding to each of the plurality of sense amplifier bands and responsive to the bank address signal and a sense activating signal for activating the sense amplifier band provided to the addressed memory block. The sense activation control circuitry includes a memory for storing bank address data to specify a memory block which has used a corresponding sense amplifier band most recently, and determination circuitry for determining match/mismatch of the bank address data stored in the memory and an applied bank address.

A semiconductor memory device according to a third aspect includes a memory array having a plurality of memory cells arranged in rows and columns, row select circuitry activated in response to array activation instruction signal for selecting a row in the memory array according to a first address signal, reading circuitry activated in response to a read operation instruction signal for selecting the row in the memory array in response to a second address signal simultaneously applied with the read operation instruction signal and reading out the data of memory cells on the selected column externally from the device, and data valid signal output circuitry for outputting externally from the device a data valid signal indicating that the data read out from the reading circuitry is valid in response to the read operation instruction signal.

Since the memory array is divided into a plurality of memory blocks each of which can be driven independently from each other, the number of banks may be increased, and page hit rate may be increased accordingly.

Furthermore, by connecting a local input/output bus and the global input/output bus in response to a signal related to column selection, the local input/output bus and global input/output bus can be connected only at the time of reading/writing operation, thereby permitting a plurality of banks to be activated at a time, and if a sense amplifier is maintained in an active state, the data of a plurality of banks may be prevented from being transferred onto the global input/output bus, and data can be read out accurately using a memory block as a bank.

In the shared sense amplifier configuration in which adjacent memory blocks shares a sense amplifier band, when a bank adjacent to a bank in an active state is accessed, the adjacent memory block in the active state is driven into an inactive state in order to prevent collision of data in the sense amplifier band, and data may be sensed and amplified. Since the inactive state is automatically established inside the device, an external device does not need a mechanism for preventing such collision of data in the sense amplifier band, and therefore the load of control for memory accessing by the external device (memory controller or processor) is alleviated.

In addition, at the time of outputting valid data, the signal indicating that the valid data is output is externally output, and therefore the external device can be accurately notified of the timing for the valid data to be output.

Furthermore, if the confliction is caused for a sense amplifier band, a command input prohibition signal is output externally, the external device can be notified that a countermeasure for preventing such sense amplifier band conflict is executed inside the semiconductor memory device, applying a next mode instruction signal can be surely prevented during the operation period and therefore erroneous accessing to the device may be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
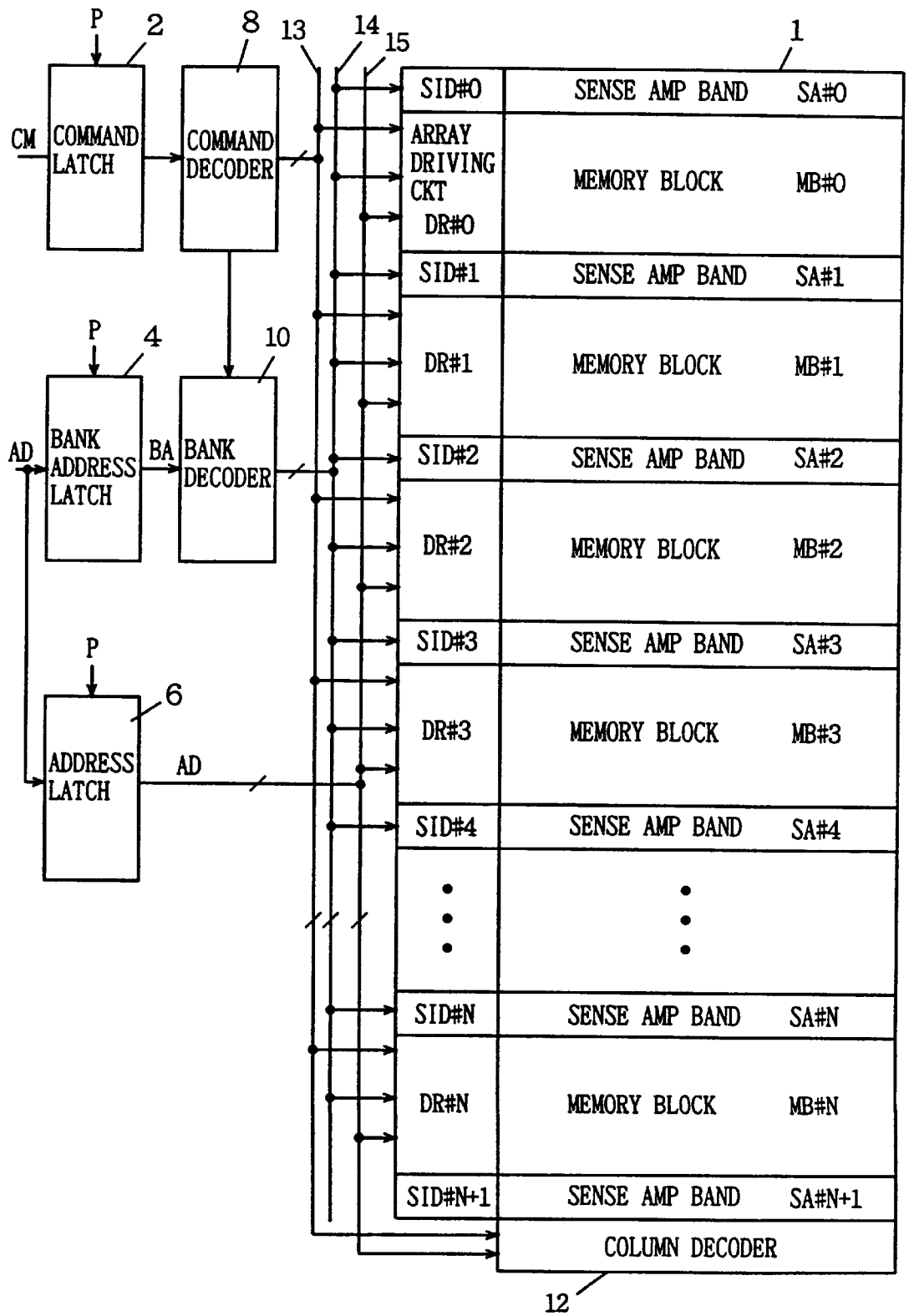
FIG. 1 is a diagram schematically showing the overall configuration of a semiconductor memory device according to the invention.

FIG. 1 is a diagram schematically showing the overall configuration of a semiconductor memory device according to the invention. In FIG. 1, the semiconductor memory device includes memory blocks MB#0–MB#N each having a plurality of memory cells arranged in a matrix of rows and columns, sense amplifier bands SA#1–SA#N provided between these memory blocks, a sense amplifier band SA#0 provided outside memory block MB#0, and a sense amplifier band SA#N+1 provided adjacent to the outside of memory block MB#N. These sense amplifier bands SA#1 to SA#N (whose configuration will be later described in detail) are shared between adjacent memory blocks. A selected memory block is connected to a corresponding sense amplifier band, and a non-select memory block paired with the select memory block is isolated from the corresponding sense amplifier band.

Array driving circuits DR#0–DR#N for activating/inactivating each memory block are provided to memory blocks MB#0 to MB#N, sense/connection control circuits SID#0 to SID#N+1 for controlling activation/inactivation of sense amplifiers included in a sense amplifier band are provided to sense amplifier bands SA#0 to SA#N+1. Array driving circuits DR#0 to DR#N each include a row decoder and a word line driver and generates a control signal related to a row selecting operation to a corresponding memory block when activated. Since these array driving circuits DR#0 to DR#N, which are activated/inactivated independently from each other each include a signal latch circuit such as row address latch circuit, though not explicitly shown.

Sense/connection control circuits SID#0 to SID#N+1 each activate a sense amplifier included in a corresponding sense amplifier band in response to a sense activation signal applied from a corresponding array driving circuit, and as will be described later, each includes a connection control circuit for controlling connection/isolation between a memory block and a sense amplifier band, and connection between a local IO bus (a data input/output bus provided to each memory block) and a global IO bus (a data input/output bus provided in common to all the memory blocks).

The semiconductor memory device further includes a command latch 2 for latching an externally applied command CM in synchronization with a clock signal P, a bank address latch 4 for latching an externally applied bank address signal in synchronization with clock signal P, an address latch 6 for latching an externally applied address signal in synchronization with clock signal P, a command decoder 8 for decoding the command latched by command latch 2 and a bank decoder 10 activated responsive to an activation signal from command decoder 8 for decoding a bank address BA latched by bank address latch 4 and generating a bank specifying signal for specifying an addressed memory block.

Command CM may be an individual control signal such as usual row address strobe signal /RAS, column address strobe signal /CAS and write enable signal /WE, or an operation mode may be specified by a combination of states of a plurality of control signals. Command decoder 8 decodes the command in order to identify the specified the operation mode, and generates a control signal required in thus identified operation mode. An output signal from command decoder 8 is transferred to array driving circuits DR#0 to DR#N through an internal control bus 13, and a bank specifying signal from bank decoder 10 is applied to array driving circuits DR#0 to DR#N and sense/connection control circuits SID#0 to SID#N+1 through bank specifying bus 14. An internal address signal latched by address latch 6 is transferred to array driving circuits DR#0 to DR#N through an internal address bus 15.

Such command decoders 8 may be provided corresponding to array driving circuits DR#0 to DR#N, and each command decoder may be selectively activated in response to a bank select signal output from bank decoder 10.

In the configuration shown in FIG. 1, memory blocks MB#0 to MB#N included in memory array 1 are driven into an active/inactive state independently from each other by array driving circuits DR#0 to DR#N. Memory blocks MB#0 to MB#N may be used as a bank. More specifically, when one memory block MB#i is in an active state, another memory block MB#j may be driven into an active state or into an inactive state (precharge state). Therefore in memory blocks MB#0 to MB#N, a row of memory cells (word line) is kept in a selected state, a larger number of pages may be kept in a selected state as compared to the conventional SDRAM configuration, thereby improving the page hit rate.

Figure 2:
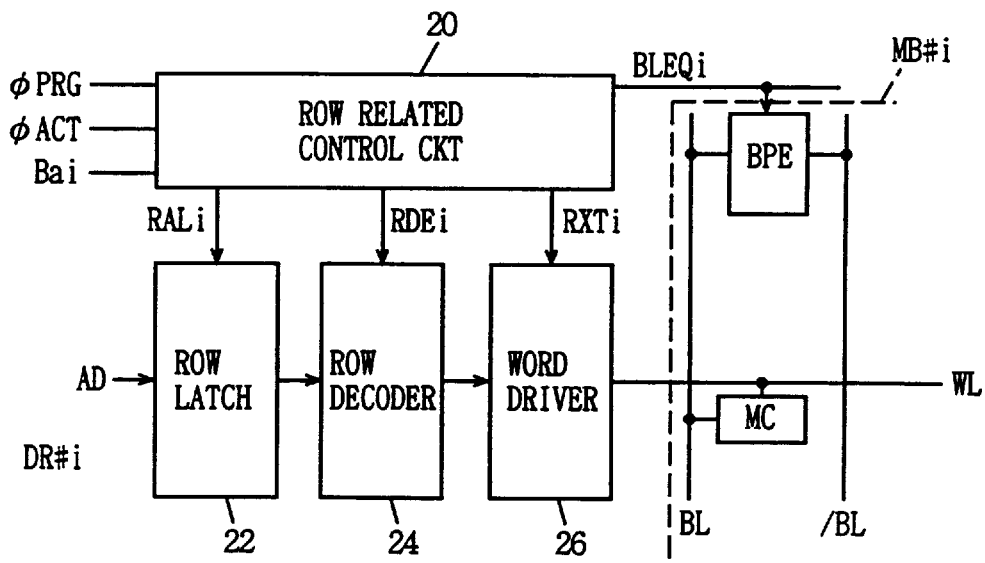
FIG. 2 is a diagram schematically showing the configuration of an array driving circuit shown in FIG. 1.

FIG. 2 is a diagram schematically showing the configuration of the array driving circuit shown in FIG. 1. Shown in FIG. 2 is the configuration of an array driving circuit DR#i provided to memory block MB#i (i=0 to N). In FIG. 2, array driving circuit DR#i includes a row-related control circuit 20 receiving an array activation instruction signal φACT, an array inactivation instruction signal PRG and a bank specifying signal Bai applied from a command decoder and generating each internal control signal, a row latch 22 incorporating and latching an internal address signal AD applied from address latch 6 shown in FIG. 1 in response to an address latch instruction signal RALi from row-related control circuit 20 and generating an internal row address signal, a row decoder 24 activated in response to a row decoder enable signal RDEi from row-related control circuit 20 and decoding the internal row address signal to generate a signal specifying a row in a memory block and a word driver 26 for driving a word line WL corresponding to the addressed row into a selected state in response to a word line driving signal RXTi.

Figure 3:
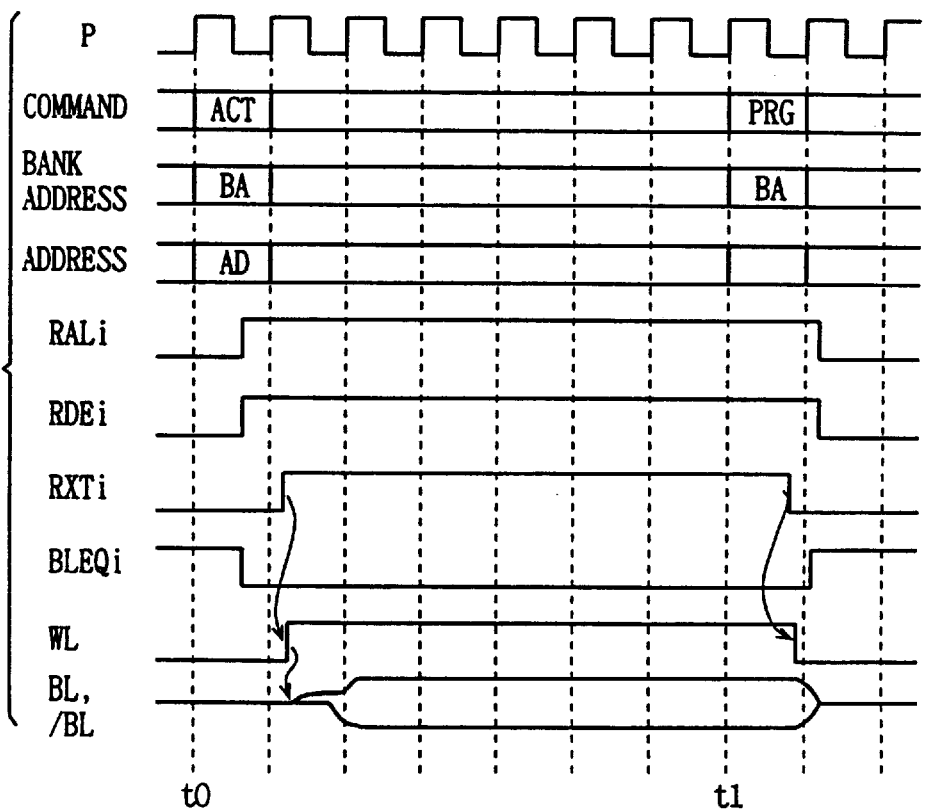
FIG. 3 is a timing chart for use in illustration of the operation of the array driving circuit shown in FIG. 2.

In memory block MB#i, there are provided word lines WL corresponding to rows of memory cells and each connected with memory cells MC in a corresponding row, and bit line pairs BL, /BL to which memory cells MC in corresponding columns are connected. In FIG. 2, one word line WL and one bit line pair BL, /BL are shown. Bit lines BL and /BL are provided with a bit line precharge/equalize circuit BPE for precharging and equalizing bit lines BL and /BL to a prescribed potential (intermediate potential) in response to a bit line equalize instruction signal BLEQ applied from row-related control circuit 22. Now, the operation of the array driving circuit shown in FIG. 2 will be described in conjunction with the timing chart in FIG. 3.

At time t0, an array activation instruction command (hereinafter referred to as active command) ACT is applied in synchronization with clock signal P. The definite state of the command may be either at a rising edge or falling edge of clock signal P. Bank address BA and address AD are applied simultaneously with active command ACT. Active command ACT is decoded by command decoder 8, and an internal array operation activation instruction signal φACT attains an active state. Meanwhile, the bank decoder is activated under the control of command decoder 8, decodes the applied bank address, and drives bank instruction signal Bai into a selected state. Row-related control circuit 20 first activates row address latch instruction signal RALi according to internal array activation instruction signal φACT and selected (active) bank instruction signal Bai. Row latch 22 thus attains a through state and then a latch state, and holds the internal address signal in a definite state. Then, row decoder 24 is activated in response to row decode enable signal RDEi from row-related control circuit 20 and decodes the applied internal row address signal.

Meanwhile, row-related control circuit 20 inactivates bit line equalize instruction signal BLEQi which has been in an active state until then according to internal array activation instruction signal φACT and selected bank instruction signal Bai, and inactivates bit line precharge/equalize circuit BPE. Thus, bit lines BL and /BL are brought into a floating state at a precharge potential of an intermediate potential.

Then, word line driving signal RXTi from row-related control circuit 20 is activated in a prescribed timing, and word driver 26 drives a selected word line WL into a selected state according to word line select signal (row specifying signal) output from row decoder 24 and word line driving signal RXTi. Then, the storage data of memory cell MC is transferred onto bit line BL (or /BL), and a potential difference corresponding to the storage information of memory cell MC is generated between bit lines BL and /BL. Then, the sense amplifier which will be described later is activated, thereby amplifying the very small potential difference between bit lines BL and /BL.

In this state, a column select operation is conducted, and data is written/read out.

At time t1, an array inactivation instruction command (hereinafter referred to as precharge command) PRG is applied together with bank address BA. Command decoder 8 once again decodes the precharge command, and brings internal array inactivation instruction signal φPRG into an active state. Bank decoder 10 is once again activated under the control of the command decoder, and bank address specifying signal Bai is activated. Row-related control circuit 20 inactivates word line driving signal RXTi (the sense amplifier is inactivated before then), and then inactivates row decoder enable signal RDEi, and row address latch instruction signal RALi. Row latch 22 maintains its latch state. Row-related control circuit 20 activates bit line equalize instruction signal BLEQi, and bit lines BL and /BL are precharged into an intermediate potential and then equalized by the function of bit line precharge/equalize circuit BPE.

Selectively activating array driving circuits DR#0 to DR#N in response to bank instruction signal Bai permits memory blocks to be driven independently from each other.

Figure 4:
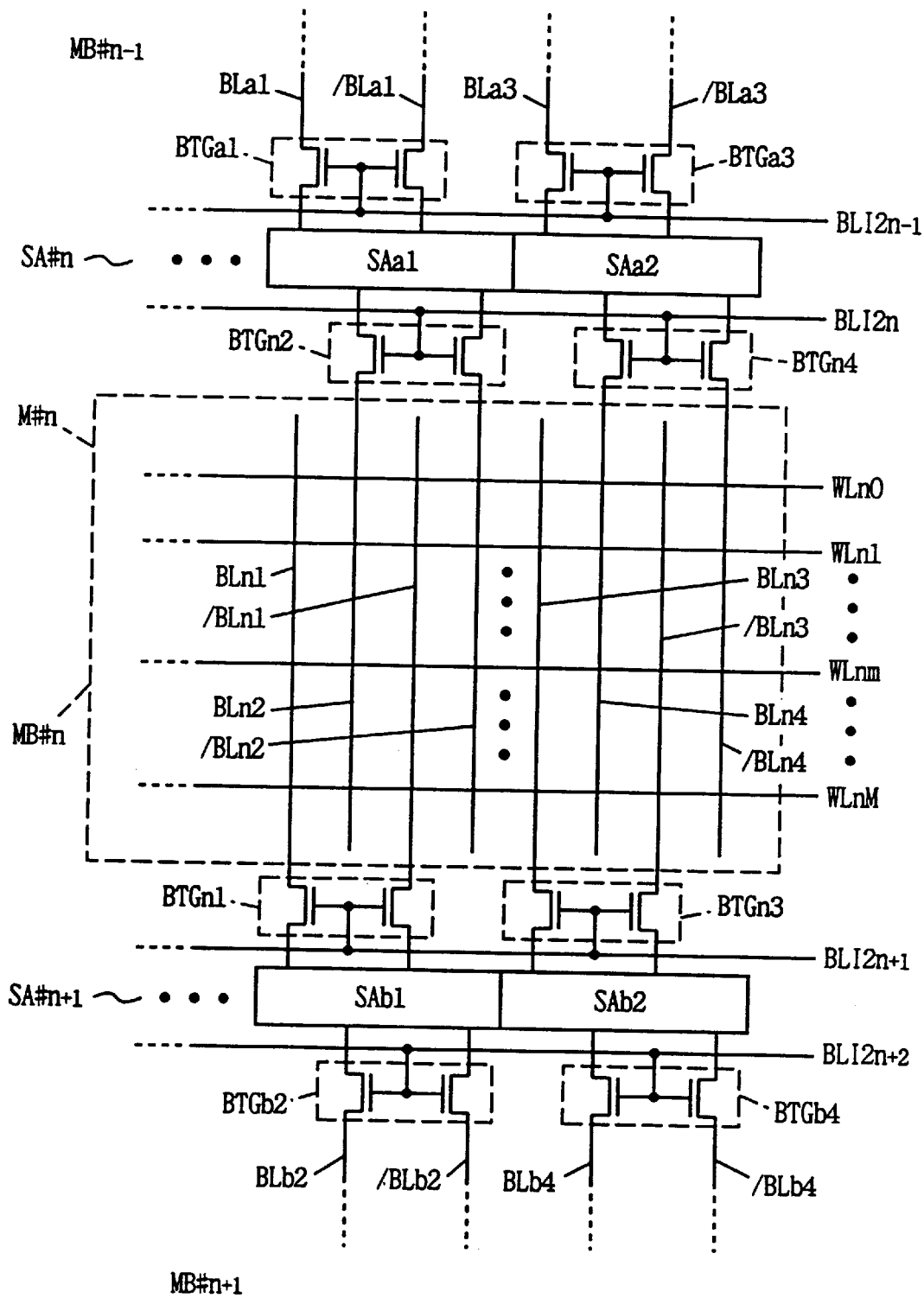
FIG. 4 is a diagram schematically showing a configuration of a memory block and a sense amplifier band shown in FIG. 1.

FIG. 4 is a diagram schematically showing the configuration of the sense amplifier band shown in FIG. 1. In FIG. 4, sense amplifier bands SA#n and SA#n+1 related to memory block MB#n are shown for the purpose of representation. Memory block MB#n includes a plurality of word lines WLn0 to WLnM, a plurality of bit lines BLn1, /BLn1, BLn2, /BLn2, BLn3, /BLn3, BLn4, and /BLn4 . . . The bit lines pairs are alternately connected to sense amplifier circuits included in sense amplifier band SA#n and SA#n+1 on both sides. More specifically, bit line pair BLn1, /BLn1 is connected to sense amplifier SAb1 in sense amplifier band SA#n+1 through bit line isolation gate BTGn1, while bit line pair BLn2, /BLn2 is connected to sense amplifier circuit SAa1 in sense amplifier band SA#n through bit line isolation gate BTGn2. Bit lines pair BLn3, /BLn3 is connected to sense amplifier circuit SAb2 in sense amplifier band SA#n+1 through bit line isolation gate BTGn3. Bit line pair BLn4, /BLn4 is connected to sense amplifier circuit SAi2 in sense amplifier band SA#n through bit line isolation gate BTGn4. Even-numbered bit line isolation gate BTGn2, BTGn4, . . . have their conduction/non-conduction controlled by bit line isolation control signal BLI2n. Odd-numbered bit line isolation gates BTGn1, BTGn3, . . . have their conduction/non-conduction controlled by bit line isolation control signal BLI2n+1.

Odd-numbered bit lines BLa1, /BLa1, BLa3, and /BLa3 are connected to sense amplifier circuits SAa1 and SAa2 through bit line isolation gates BTGa1, BTGa3. Bit line isolation gates BTGa1, BTGa3 have their conduction/non-conduction controlled by bit line isolation control signal BLI2n−1. Even-numbered bit lines BLb2, /BLb2, BLb4, and /BLb4 in memory block MB#n+1 are connected to sense amplifier circuits SAb1, SAb2 through bit line isolation gates BTGb2, BTGb4. Bit line isolation gates BTGb2, BTGb4, . . . have their conduction/non-conduction controlled by bit line isolation control signal BLI2n+2.

As the sense amplifier band is shared between adjacent two memory blocks, the area occupied by sense amplifier band can be reduced as compared to the configuration with a sense amplifier being provided to each memory block. As the bit line pairs of memory cell blocks MB#n are alternately connected to sense amplifier bands on both sides, the pitch of sense amplifier circuits in a sense amplifier band is made twice the pitch of the bit line pair, which makes it easier to provide sense amplifier.

Figure 5:
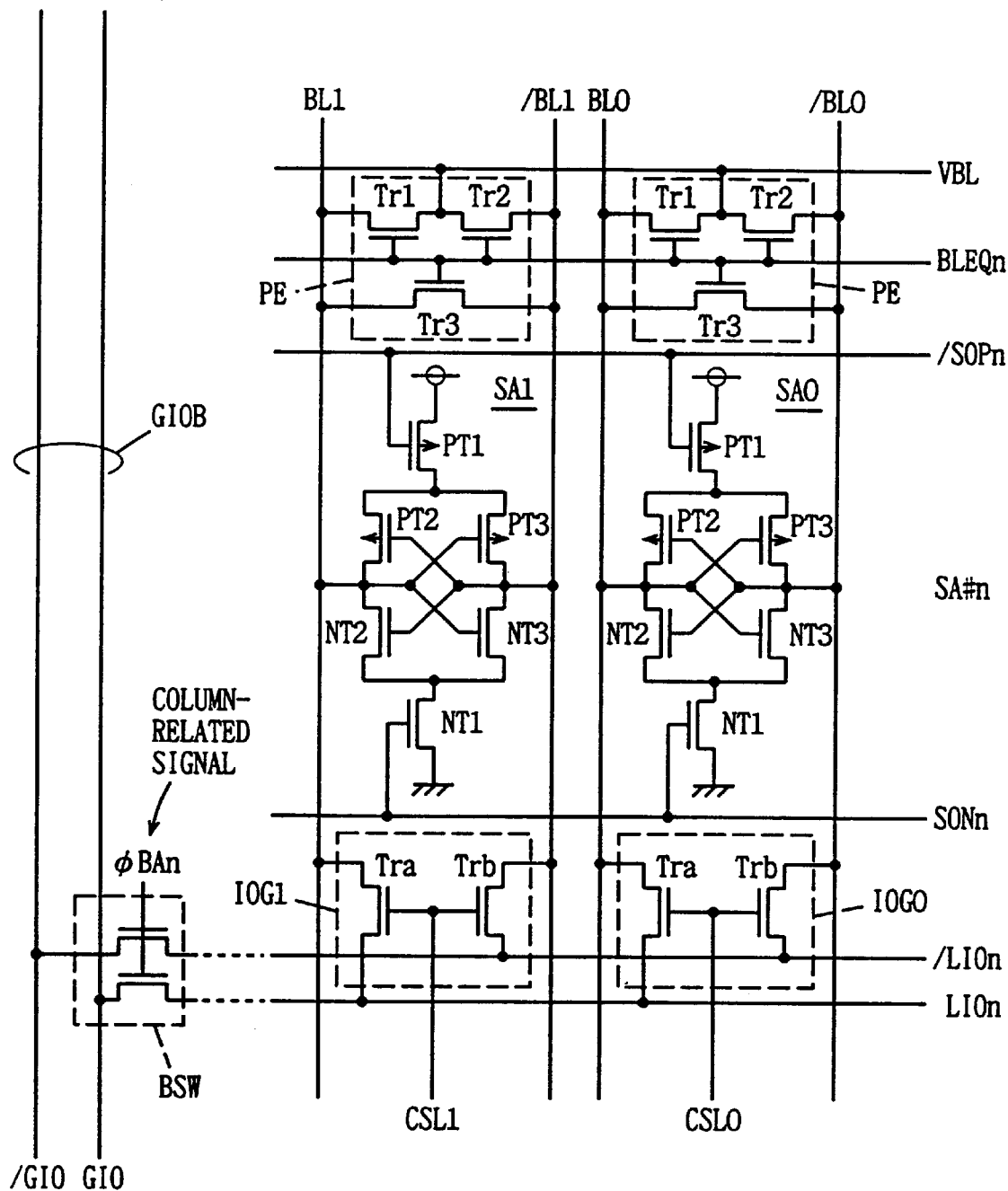
FIG. 5 is a diagram for specifically showing the configuration of the sense amplifier band shown in FIG. 4.

FIG. 5 is a diagram showing in detail the configuration of sense amplifier circuits in FIG. 4. In FIG. 5, the configuration of sense amplifier circuits included in one sense amplifier band are shown. In FIG. 5, bit line pairs connected to sense amplifiers included in the same sense amplifier band are illustrated as bit lines BL0, /BL0 and BL1, /BL1.

In FIG. 5, the sense amplifier circuit includes a precharge/equalize circuit PE activated in response to bit line equalize instruction signal BLEQn for precharing and equalizing a corresponding bit line pair (BL0, /BL0 or BL1, BL1) to a prescribed intermediate potential VBL, a sense amplifier SA (SA0 or SA1) activated in response to sense amplifier activation signal SONn and /SOPn for differentially amplifying the potential of a corresponding bit line pair (BL0, /BL0 or BL1, /BL1), a column select gate IOG (IOG0 or IOG1) conducting in response to a column select signal CSL (CSL0 or CSL1) applied from a column decoder for connecting a corresponding bit line pair (BL0, /BL0 or BL1, /BL1) to a local IO line LIOn, /LIOn. The signal line transferring column select signal CSL (CSL0 or CSL1) are provided to extend over all the memory blocks. In FIG. 5, only one bit line pair selected in response to a column select signal from a column decoder is connected to local IO line (local IO bus). However, a plurality of bits (a plurality of pairs of bit lines) may be selected at a time and connected to a plurality of local IO lines.

Bit line precharge/equalize circuit PE includes n channel MOS transistors Tr1, Tr2 conducting in response to bit line equalize instruction signal BLEQn for transferring precharge voltage VBL a prescribed intermediate potential, to a corresponding bit line, and an n channel MOS transistor Tr3 conducting in response to bit line equalize instruction signal BLEQn for electrically short-circuiting corresponding bit lines.

Sense amplifier SA (SA0 or SA1) includes p channel MOS transistors PT2 and PT3 cross-coupled for driving the bit line of a higher potential of a corresponding bit line pair to a power supply potential level, n channel MOS transistors NT2 and NT3 cross-coupled for driving the bit line of a potential of a corresponding bit line pair to ground potential level, a p channel MOS transistor PT1 conducting in response to sense amplifier activation signal /SOPn for activating a sense amplifier portion (P sense amplifier) formed of cross-coupled p channel MOS transistors, and an n channel MOS transistor NT1 conducting in response to sense amplifier activation signal SONn for activating a sense amplifier portion (N sense amplifier) formed of cross-coupled n channel MOS transistors NT2 and NT3.

Column select gate IOG (IOG0 or IOG1) includes n channel MOS transistors Tra and Trb conducting in response to column select signal CSL (CSL0 or CSL1) for connecting corresponding bit lines BL, /BL to local IO lines LIOn and /LIOn, respectively.

Local IO lines LIOn and /LIOn are provided only to a corresponding memory block, and provided along the direction in which word lines extend. Local IO lines LIOn and /LIOn are connected to global IO lines GIO, /GIO through a bank select switch BSW conducting in response to a bank select signal φBAn. Global IO lines GIO, /GIO (Global IO bus GIOB) are provided in common to all the memory blocks MB#0 to MB#N. Therefore, only the local IO line provided to a selected memory block is connected to global IO bus GIOB.

Figure 6:
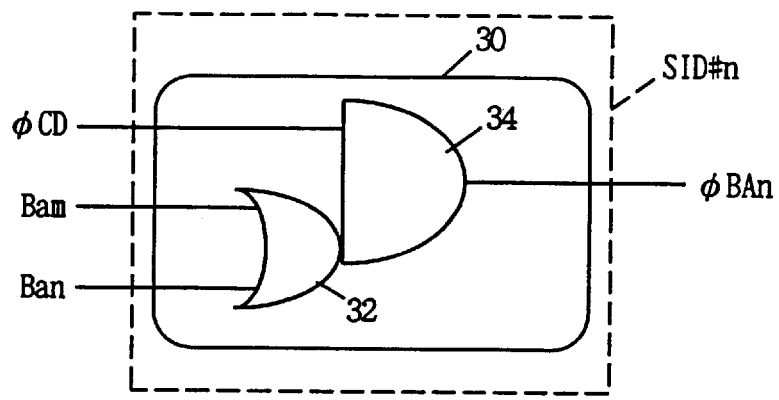
FIG. 6 is a diagram schematically showing the configuration of a control circuit for connecting a local IO bus and a global IO bus shown in FIG. 5.

FIG. 6 is a diagram showing the configuration of the portion generating bank select signal φBA (φBAn). The bank select signal generation portion is included in sense/isolation control circuit SID(SID#0 to SID#N) shown in FIG. 1. In FIG. 6, bank select signal generation portion 30 includes an OR gate 32 receiving a bank specifying signal Ban and an adjacent bank specifying signal Bam, and an AND gate 34 receiving a timing signal φCD and the output signal of OR gate 32. Bank select signal φBAn is output from AND gate 34. Bank specifying signal Bam specifies a memory block adjacent to memory block MB#n, in other words it specifies a memory block MB#n−1 or MB#n+1.

A set of bank specifying signals specifying memory blocks to share a sense amplifier band are applied to OR gate 32. Timing signal φCD attains an H level of activated state in a prescribed timing in response to a column select operation initiating signal as data writing or data reading operation is specified and a column select operation is executed.

Figure 7:
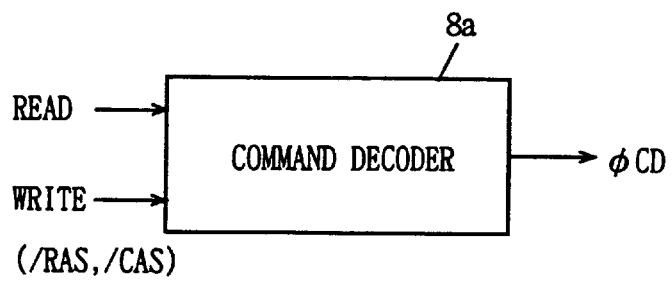
FIG. 7 is a diagram schematically showing the configuration of a portion generating a control signal shown in FIG. 6.

FIG. 7 is a diagram showing an example of the configuration of the timing signal φCD generation portion shown in FIG. 6. In FIG. 7, a command decoder 8a maintains timing signal φCD at an H level in a prescribed time period in response to a read command READ specifying a data reading operation or a write command WRITE specifying a data writing operation. Timing signal φCD is applied in common to memory blocks MB#0 to MB#N. The read command and write command may be provided in a combination of row address strobe signal /RAS and column address strobe signal /CAS.

Figure 8:
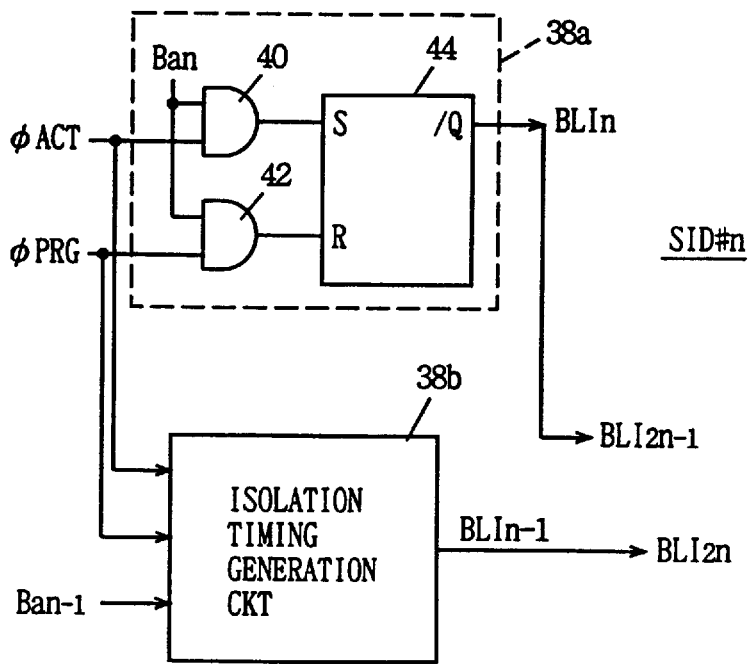
FIG. 8 is a diagram schematically showing the configuration of a bit line isolation signal generation portion shown in FIG. 5.

FIG. 8 is a diagram showing the configuration of the portion generating bit line isolation instruction signals BLI2n and BLI2n−1 shown in FIG. 5. The bit line isolation control signal generation portion is included in sense/isolation control circuit SID (SID#0 to SID#N) in FIG. 1. In FIG. 8, the configuration of the isolation signal generation portion provided to memory block MB#n is shown. Sense/isolation control circuit SID#n includes an isolation timing generation circuit 38a for generating a bit line isolation instruction signal BLI2n−1, and an isolation timing generation circuit 38b for generating a bit line isolation instruction signal BLI2n.

Isolation timing generation circuit 38a includes an AND circuit 40 receiving bank specifying signal Ban and array activation instruction signal φACT, an AND circuit 42 receiving bank specifying signal Ban and array inactivation instruction signal (precharge instruction signal) φPRG, and a set/reset flip-flop 44 receiving an output signal from AND circuit 40 at its set input S and receiving an output signal from AND circuit 42 at its rest input R. Bit line isolation instruction signal BLI2n−1 is output from the complementary output /Q of set/reset flip-flop 44. Isolation timing generation circuit 38a outputs bit line isolation instruction signal BLI2n in response to bank specifying signal Ban−1, array activation instruction signal φACT and array inactivation instruction signal φPRG. Isolation timing generation circuits 38a and 38b have the same configuration.

In the configuration shown in FIG. 8, as memory block MB#n is selected, bit line isolation instruction signal BLI2n−1 attains an L level. Meanwhile, bit line isolation instruction signal BLI2n is maintained at an H level. Selected memory block MB#n is connected to sense amplifier band SA#n.

In a stand-by state, isolation instruction signals BLI2n−1 and BLI2n output from isolation timing generation circuit 38b are both at an H level, and memory blocks MB#n−1 and MB#n sharing sense amplifier band SA#n are both connected to sense amplifier band SA#n. The bit line precharge/equalize circuit included in the sense amplifier band precharges each column in the memory block to intermediate potential VBL.

[First Embodiment]

Figure 9:
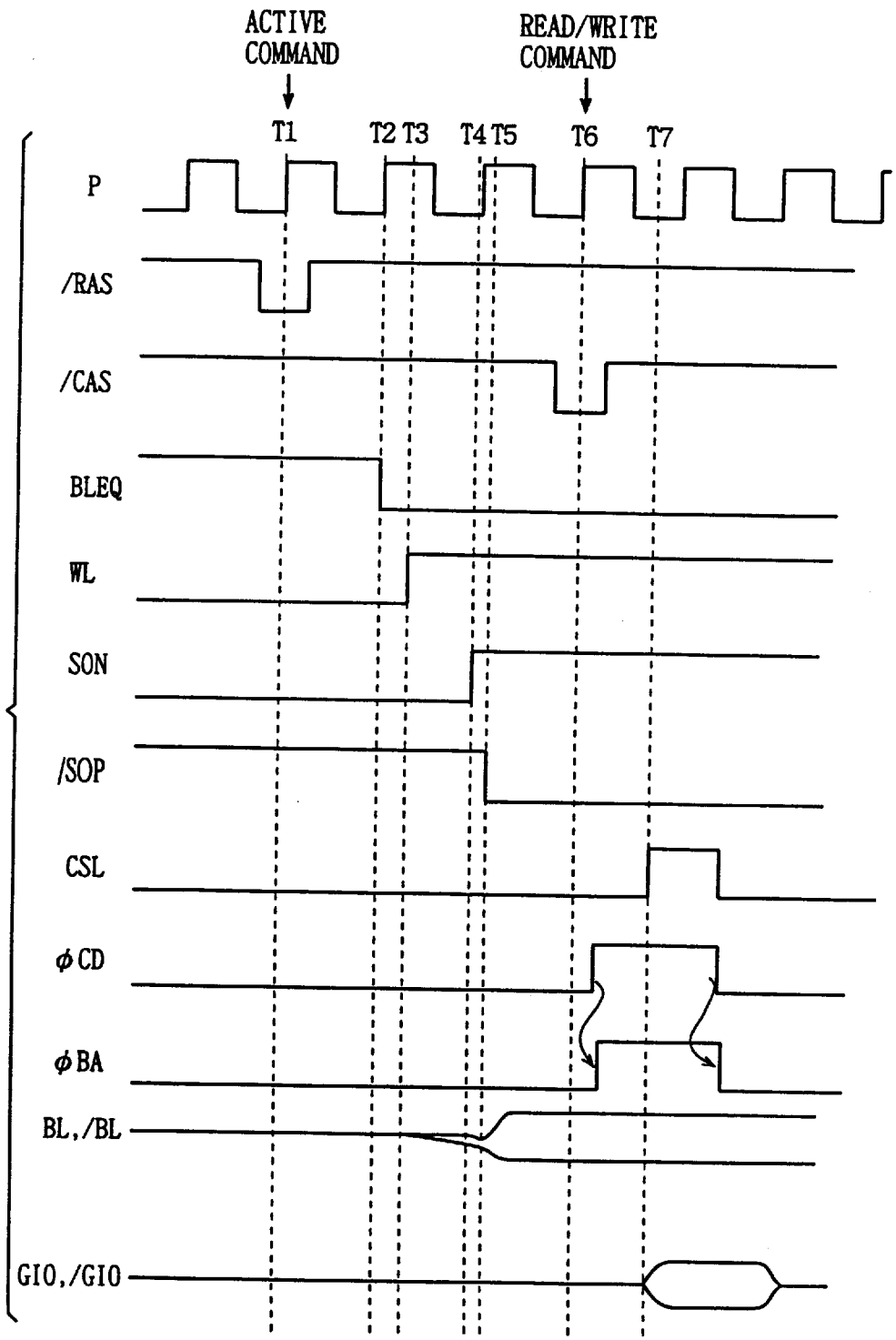
FIG. 9 is a timing chart for use in illustration of the operation of a semiconductor memory device according to a first embodiment of the invention.

FIG. 9 is a timing chart for use in illustration of the operation of a semiconductor memory device according to a first embodiment of the invention. In FIG. 9, an active command is applied when row address strobe signal /RAS is at an L level and column address strobe signal /CAS is at an H level as clock signal P rises. A read/write command is applied when row address strobe signal /RAS is at an H level and column address strobe signal /CAS is at an L level at a rising edge of clock signal P.

Note that the timing chart shown in FIG. 9 does not show a particular memory bank. The control signals change as shown in FIG. 9 in a selected memory bank.

At time T1, the active command is applied. Accordingly, at time T2, bit line equalize instruction signal BLEQ is pulled to an L level active state. Thus, a bit line precharge/equalize circuit included in a sense amplifier band provided corresponding to a selected memory block is brought into an inactive state. The bit line equalize instruction signal needs only be such that the equalize/precharge operation completes if one of the two memory blocks sharing the sense amplifier band is selected, and the signal can be readily generated by taking a logical sum of bank specifying signals to memory blocks sharing the sense amplifier band.

Then, at time T3, a row select operation is conducted in the selected memory block, and the potential of selected word line WL rises.

At time T4, sense amplifier activation signal SON is activated, a sense amplifier formed of n channel MOS transistors included in a sense amplifier band corresponding to the selected memory block (N sense amplifier) operates, and at time T5, sense amplifier activation signal /SOP attains an active L level. Thus, a very small potential generated on each bit line BL, /BL in response to the rising of the potential of selected word line WL at time T3 is sensed, amplified and latched. Herein, in FIG. 9, the potential change of bit line BL, /BL when the selected memory cell stores L level data is shown by way of illustration. The series of these operations completes the row selection related operation.

At time T6, a read/write command is applied. A column select operation is initiated in response to the read/write command, timing signal φCD is output from command decoder 8a shown in FIG. 7, and bank specifying signal φBA to a selected memory block is pulled to an H level accordingly (refer to FIG. 6). Thus, local IO lines LIO, /LIO provided to the selected memory block are connected to global IO lines GIO, /GIO. In this state, global IO line pair and local IO line pair both maintain a precharge state.

At time T7, the column decoder is activated in response to the read/write command, decodes the applied address signal, and pulls column select signal CSL to an H level. Thus, the memory cell data (which has been latched by the sense amplifier) in the selected memory block is transferred to global IO lines GIO and /GIO through local IO lines LIO, /LIO. The memory cell data read out onto global IO lines GIO, /GIO is output through a preamplifier and an output buffer which are not shown. If a write command is applied, data is written into a selected memory cell through global IO lines GIO, /GIO, local IO lines LIO, /LIO and a sense amplifier band by a write driver which is not shown.

Using, as signals which control the connection between local IO lines and global IO lines, the signals related to a column selection, data does not collide on a global IO bus even if a plurality of banks are in an active state a time. If a local IO line and a global IO line are connected in response to a control signal from a row-related control circuit and a memory bank is in a selected state, the signal output from the row-related control circuit is in an active state, and therefore, the local IO line and global IO line are in a connected state. Therefore, data from one memory block is read out onto the global IO line in this case. In this state, if another bank is accessed, the data in this newly accessed memory bank collides with data in the memory block previously read out, which precludes accurate reading of data.

However, according to the first embodiment, a local IO line and a global IO line are connected using a control signal related to a column selection, local IO lines LIO, /LIO and global IO lines GIO, /GIO can be connected only when writing/reading data to/from a memory block is executed. The collision of data can be prevented even if a plurality of memory banks in an active state at a time, permitting accurate reading of data.

After data is written/read, the local IO line and global IO lines are precharged/equalized to a prescribed potential at the time of the completion of the column select operation.

In addition, if the column decoder is provided in common to memory blocks MB#0 to MB#N, column select signal CSL is commonly applied to all the memory blocks. However, the data of these memory blocks is at best transferred onto local IO lines LIO, /LIO, rather than to global IO lines GIO, /GIO, and therefore data dose not collide.

As described above, in the configuration taking advantage of each memory block in a memory array with a shared sense amplifier configuration as a bank, a local IO line provided only to each memory block and a global IO line provided in common to the memory blocks are connected, using a control signal related to a column select operation, data does not collide on global IO line even if a plurality of banks are in a selected state a time, and therefore data can be written/read accurately.

[Second Embodiment]

Figure 10:
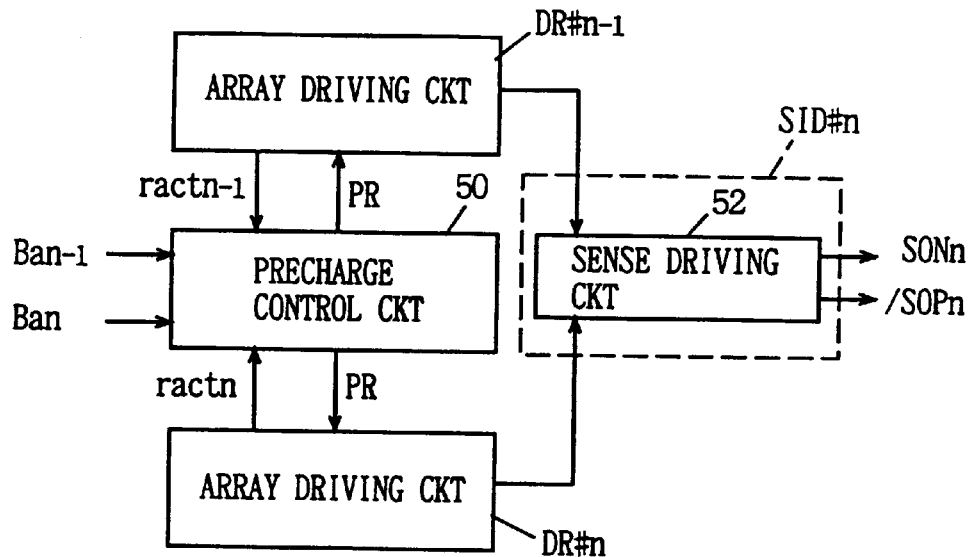
FIG. 10 is a diagram schematically showing the configuration of a main portion of a semiconductor device according to a second embodiment of the invention.

FIG. 10 is a diagram showing a main portion of a semiconductor memory device according to a second embodiment of the invention. FIG. 10 shows an array driving circuit DR#n-1 for driving memory block MB#n-1, an array driving circuit DR#n for activating/inactivating memory block MB#n, and a part of a sense amplifier/isolation control circuits SID#n for driving a sense amplifier band SA#n provided between these memory blocks MB#n-1 and MB#n. Sense/isolating control circuits SID#n includes a sense driving circuit 52 outputting a sense amplifier activation signals SONn and /SOPn to a sense amplifier band (SA#n) in response to sense amplifier activation signals applied both from array driving circuits DR#n-1 and DR#n.

These array driving circuits DR#n-1 and DR#n are provided with a precharge control circuit 50 for preventing a confliction of sense amplifier bands. Precharge control circuit 50 includes a portion for storing data indicating a memory block (bank) using a corresponding sense amplifier band (SA#n), and it is activated in response to a rising of one of array activation instruction signals ractn-1 and ractn applied from array driving circuits DR#n-1 and DR#n, compares bank specifying signal Ban-1 or Ban with bank address information stored and outputs a signal PR representing the result of comparison. Signal PR is activated when a corresponding sense amplifier band is in an active state, and a memory block different from a memory block to which the sense amplifier band is connected is newly specified. Array driving circuits DR#n-1 and DR#n cause an array which has been in an active state to return to a precharge state in response to the activation of signal PR. After the precharge state is established, the array of memory block newly addressed is activated and the sense amplifier band and the memory block are connected.

Figure 11:
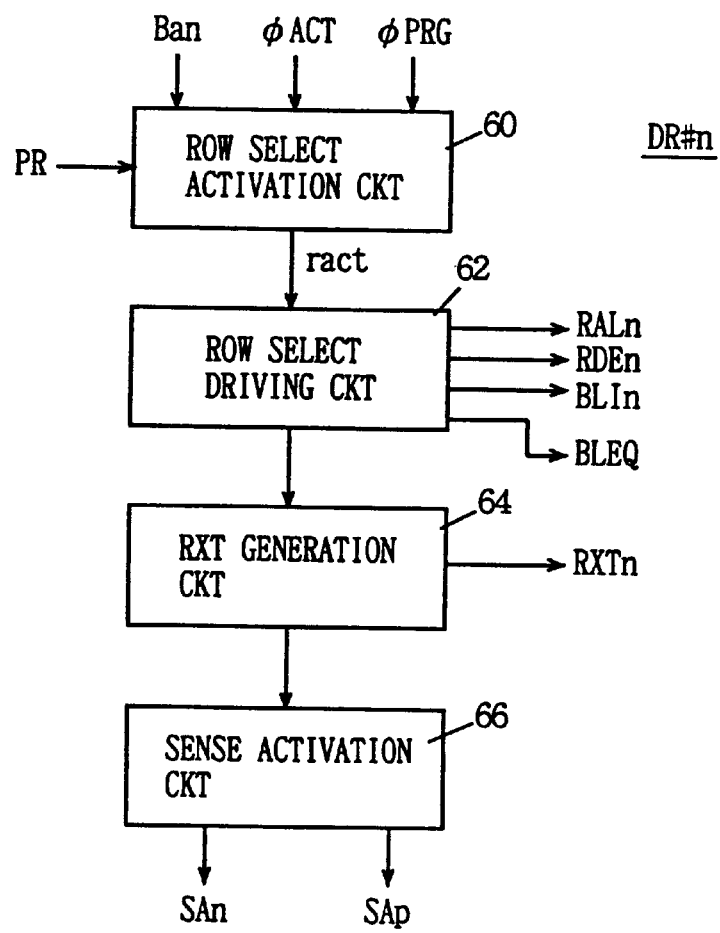
FIG. 11 is a diagram schematically showing the configuration of an array driving circuit shown in FIG. 10.

FIG. 11 is a diagram schematically showing the configuration of array driving circuit DR#n shown in FIG. 10. Array driving circuit DR#n-1 has the same configuration.

Array driving circuit DR#n includes a row select activation circuit 60 receiving band specifying signal Ban, array activation specifying signal φACT, array precharge instruction signal φPRG, and signal PR for outputting row select operation activation signal ract, a row select driving circuit 62 activated in response to row select operation activation signal ract for outputting control signals RALn, RDEn, BLIn, and BLEQ for driving circuits related to a row selection, an RXT generation circuit 64 outputting a word line driving timing signal RAXTn in a prescribed timing in response to an output signal from row select driving circuit 62, and a sense activation signal generation circuit 66 responsive to an activation of word line driving timing signal RXTn for outputting sense amplifier activation signals SAn and SAp after the passage of a prescribed time period. Sense amplifier activation signals SAn and SAp output from sense activation signal generation circuit 66 are applied to sense driving circuit 52. Sense driving circuit 52 outputs sense amplifier activation signals SONn and /SOPn based on sense amplifier activation signals SAn and SAp applied from one of array driving circuits DR#n-1 and DR#n.

Figure 12:
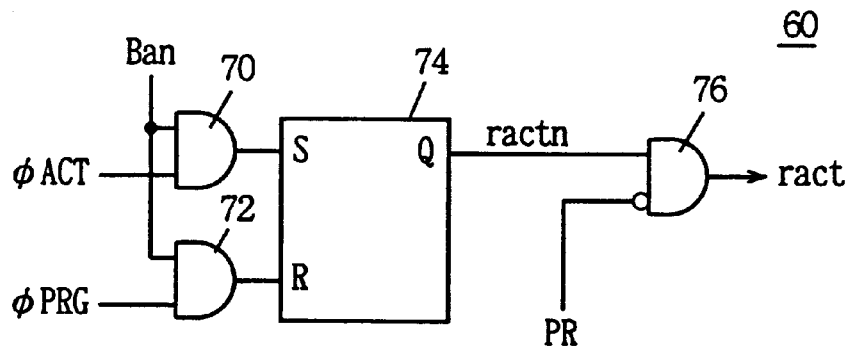
FIG. 12 is a diagram schematically showing the configuration of a row select activation circuit shown in FIG. 1.

FIG. 12 is a diagram showing one example of the configuration of row select activation circuit 60 shown in FIG. 11. In FIG. 12, row select activation circuit 60 includes an AND circuit 70 receiving bank specifying signal Ban and array activation instruction signal φACT, an AND circuit 72 receiving bank specifying signal Ban and array precharge instruction signal φPRG, a set/reset flipflop 74 set in response to activation of an output signal from AND circuit 70 and reset in response to a rising of an output signal from AND gate 72, and a gate circuit 76 receiving signals ractn and signal PR from the output Q of set/reset flipflop 74. Gate circuit 76 operates as a buffer with signal PR at an L level, and outputs row select operation activation signal ract based on signal ractn output from flipflop 74. If signal PR is pulled to an H level, array row select operation initiating instruction signal ract from gate circuit 76 attains an L level.

As signal ract falls to an L level, a precharge operation inactivating memory block MB#n is conducted. Therefore, if precharge control circuit 50 shown in FIG. 10 indicates a confliction for a sense amplifier band, an active memory block using the sense amplifier band is driven to a precharge state. After thus driving the active state memory block to the precharge state, the addressed memory block is activated.

Figure 13:
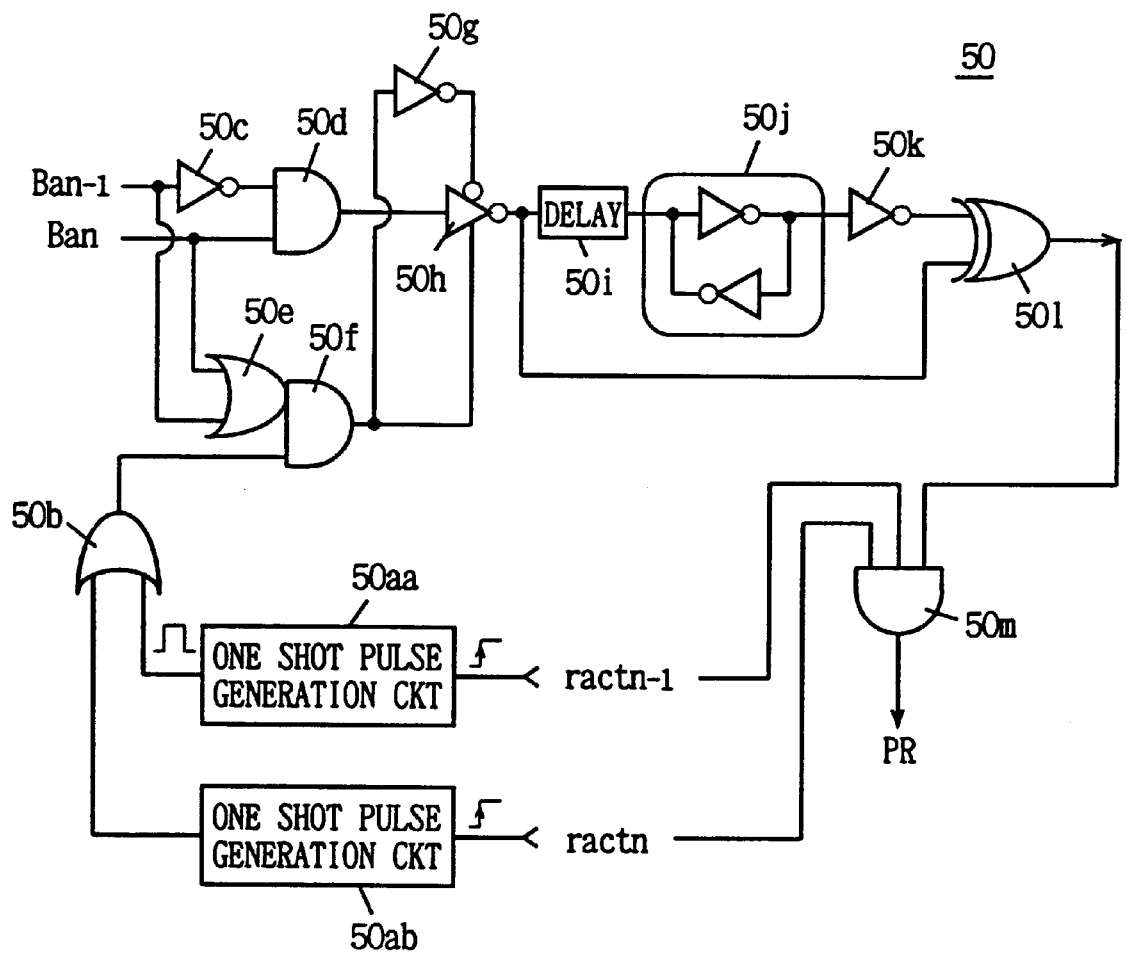
FIG. 13 is a diagram schematically showing the configuration of a sense driving circuit shown in FIG. 11.

FIG. 13 is a diagram showing an example of the configuration of precharge control circuit 50 shown in FIG. 10. In FIG. 13, precharge control circuit 50 includes a one shot pulse generating circuit 50aa for generating a one shot pulse signal pulled to an H level in a prescribed time period in response to a rising of row select operation initiation instruction signal ractn–1, a one shot pulse generating circuit 50ab for generating a one shot pulse having a prescribed time width in response to a rising of signal ractn, an OR circuit 50b receiving output signals from one shot pulse generating circuits 50aa and 50ab, an inverter 50c receiving bank specifying signal Ban–1, an AND circuit 50d receiving bank specifying signal Ban and an output signal from inverter 50c, an OR gate 50e receiving bank specifying signals Ban–1 and Ban, an AND gate 50f receiving an output signal from OR gate 50e and an output signal from OR circuit 50b, an inverter 50g receiving an output signal from AND gate 50f, a tristate inverter buffer 50h activated as the output signal of inverter 50g is at an L level and the output signal of AND gate 50f is at an H level for inverting the output signal of AND circuit 50d, a delay circuit 50i delaying the output signal of tristate inverter buffer 50h by a prescribed time period, a latch circuit 50j inverting and latching the output signal of delay circuit 50I, an inverter 50k inverting the output signal of latch circuit 50j, a 2-input EXOR circuit 50I receiving the output signal of inverter 50k and the output signal of tristate inverter buffer 50h, and a 3-input AND circuit 50m receiving row select operation initiating instruction signals ractn–1 and ractn and the output signal of EXOR circuit 50I.

Signal PR is output from AND circuit 50m. Now, the operation of the precharge control circuit shown in FIG. 13 will be described.

If memory block MB#n–1 or MB#n is specified, a one shot pulse is generated from one shot pulse generation circuit 50aa or 50ab, and the output signal of OR circuit 50b is pulled to an H level. When memory block MB#n–1 or MB#n is specified, one of bank specifying signals Ban–1 and Ban attains an H level, and the output signal of OR gate 50e is pulled to an H level. Thus, tristate inverter buffer 50h is activated and the output of AND circuit 50d is inverted. When bank specifying signal Ban–1 is at an L level, and bank specifying signal Ban is at an H level, the output signal of AND circuit 50d attains an H level. Conversely, if bank specifying signal Ban–1 is at an H level and bank specifying signal Ban is at an L level, AND circuit 50d outputs an L level signal.

If memory block which has most recently used a sense amplifier band is memory block MB#n–1, latch circuit 50j stores an L level ("0"), the output signal of inverter 50k attains an H level ("1") accordingly, while when memory block MB#n is most recently using a sense amplifier band, latch circuit 50j latches an H level signal, and the output signal of inverter 50k attains an L level. Tristate inverter buffer 50h inverts the output signal of AND circuit 50d. Therefore, if memory block MB#n is specified, the output signal of tristate inverter buffer 50h attains an L level, while if memory block MB#n–1 is specified, the output signal of tristate inverter 50h attains an H level. Therefore, if a memory block which has used a sense amplifier band and a memory block which is newly using the sense amplifier band are different, the logics of the signals applied to the inputs of EXOR circuit 50I are different, and the output signal of EXOR circuit 50I attains an H level. Meanwhile, if the same memory block sequentially uses a sense amplifier band, the output signal of EXOR circuit 50I is at an L level. AND circuit 50m receives operation initiation signals ractn–1 and ractn, and detects a confliction for a sense amplifier band. Therefore, if for example memory block MB#n–1 uses a sense amplifier band and is inactivated, and then memory block MB#n is specified, signal PR can be surely prevented from being generated.

Maintaining row select operation activation signal ract applied to internal row select driving circuit 62 in an inactive state during the delay time by delay circuit 50i in response to signal PR prevents a confliction in the shared sense amplifier band, while one memory block may regain a precharge state, and then the other memory block may be driven into an active state. The delay time by delay circuit 50i may be determined about as long as an RAS precharge time period tPR.

Figure 14:
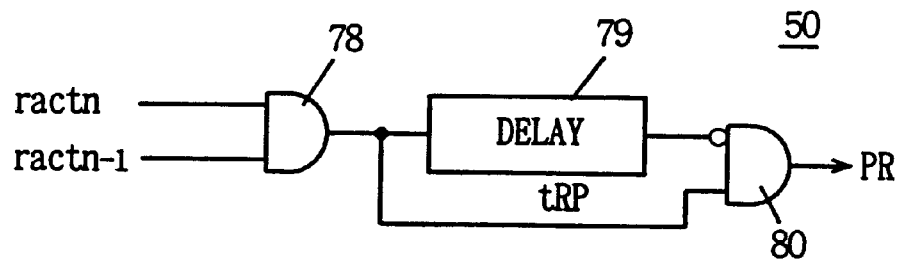
FIG. 14 is a diagram schematically showing the configuration of a variation of the second embodiment of the invention.

FIG. 14 is a diagram showing another configuration of the precharge control circuit. In FIG. 14, precharge control circuit 50 includes an AND circuit 78 receiving row select operation initiation instruction signals ractn and ractn–1, a delay circuit 79 delaying the output signal of AND circuit 78 by a prescribed time period, and a gate circuit 80 receiving the output signal of delay circuit 79 and the output signal of AND circuit 78. The output signal PR of gate circuit 80 is at an H level when the output signal of delay circuit 79 is at an L level and the output signal of AND circuit 78 is at an H level.

Signals ractn and ractn–1 are both pulled to an H level. This indicates that a confliction is present for the sense amplifier band. If therefore signal PR is raised to an H level when the output signal of AND circuit 78 is pulled to an H level, the confliction for the sense amplifier can readily be detected. The delay time by delay circuit 79 is about as long as RAS precharge time tRP. As is the configuration shown in FIG. 13, such a confliction for a sense amplifier band can be surely prevented.

Figure 15:
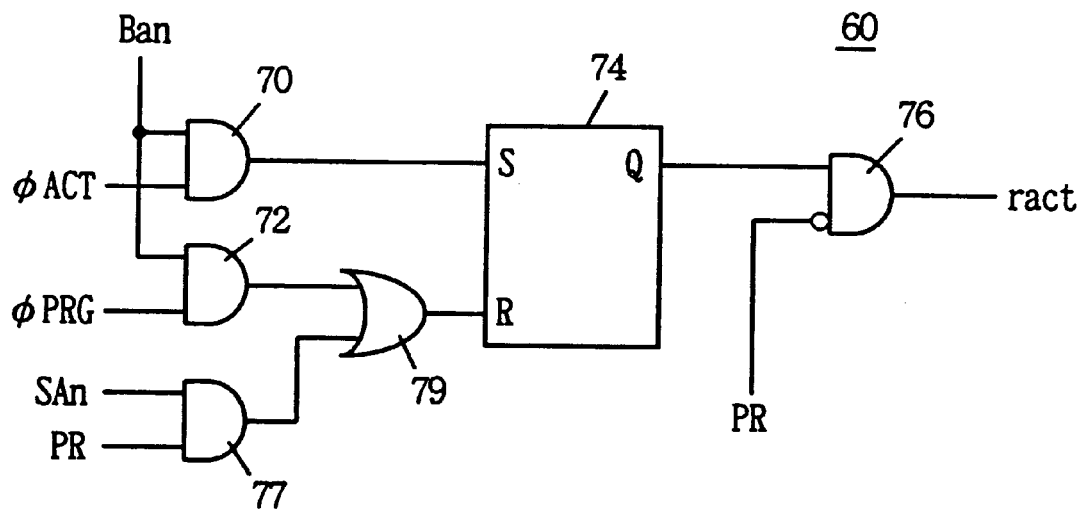
FIG. 15 is a diagram schematically showing the configuration of a variation of the row select activation circuit according to the second embodiment of the invention.

FIG. 15 is a diagram showing another configuration of row select activation circuit 60 shown in FIG. 11. In FIG. 15, row select activation circuit 60 includes, in addition to the configuration shown in FIG. 12, an AND gate 77 receiving sense amplifier activation signal SAn and precharge signal PR, and an OR circuit 79 receiving the output signals of AND circuits 72 and 77. The output signal of OR circuit 79 is applied to the reset input R of a set/reset flipflop 74. The other configuration is the same as that in FIG. 12, and corresponding portions are denoted with the same reference numeral and characters.

In the configuration shown in FIG. 15, when sense amplifier activation signal SAn is in an active state, signal PR is pulled to an H level, and if a confliction for a sense amplifier is indicated, flipflop 74 is reset through OR circuit 79, pulling row select operation activation signal ract to an L level. Therefore, if a sense amplifier band is previously being used, and another memory block is addressed, the memory block which should be kept in an inactive state after the completion of a precharge operation can be prevented from being pulled to an active state again.

As described above, according to the second embodiment, while memory blocks sharing a sense amplifier band are selected at a time, this is detected and a previously selected memory block can be driven into an inactive state, and therefore, a confliction of data in the sense amplifier band can be prevented, thus surely sensing/amplifying the data.

[Third Embodiment]

Figure 16:
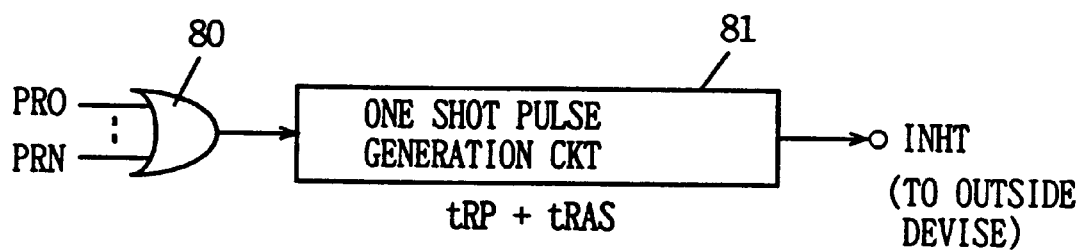
FIG. 16 is a diagram schematically showing the configuration of a main portion of a semiconductor memory device according to a third embodiment of the invention.

FIG. 16 is a diagram showing a main part of a semiconductor memory device according to a third embodiment of the invention. In FIG. 16, there are provided an OR circuit 80 receiving signals PR0 to PRn, and a one shot pulse generation circuit 81 for generating a one-shot pulse having a prescribed pulse width in response to a rising of an output signal from OR circuit 80. Signals PR0 to PRn correspond to an output signal PR from a precharge control circuit for each memory block shown in the above second embodiment. More specifically, any of signals PR0 to PRn rising to an H level indicates that there is generated a conflict for accessing a sense amplifier band within the semiconductor memory device, an operation of precharging the memory block in conflict is executed in time. Prior to the precharge operation, a command input prohibition signal INHT from one shot pulse generation circuit 81 is output externally from the device. One shot pulse generation circuit 81 generates a pulse of a pulse width of a sum of an RAS precharge time period tRP and an RAS access time period tRAS. The RAS access time period is a time period required for driving a word line in a memory block into a selected state, detection/amplification and latching of data in a memory cell in the selected row by a sense amplifier. In response to command input prohibition signal INHT output externally, the external device is signaled of the confliction caused for the sense amplifier band and enters a wait state during the period.

As shown in FIG. 16, as confliction detection signals PRO to PRn for sense amplifier band are activated, thus outputting command input prohibition signal INHT externally from the device permits the generation of the confliction for the sense amplifier to be known outside the device, input of another command before the previously applied command is completely executed can be prevented, and if a read command is applied, for example, necessary data can be accurately and surely read out after applying an active command.

[Fourth Embodiment]

Figure 17:
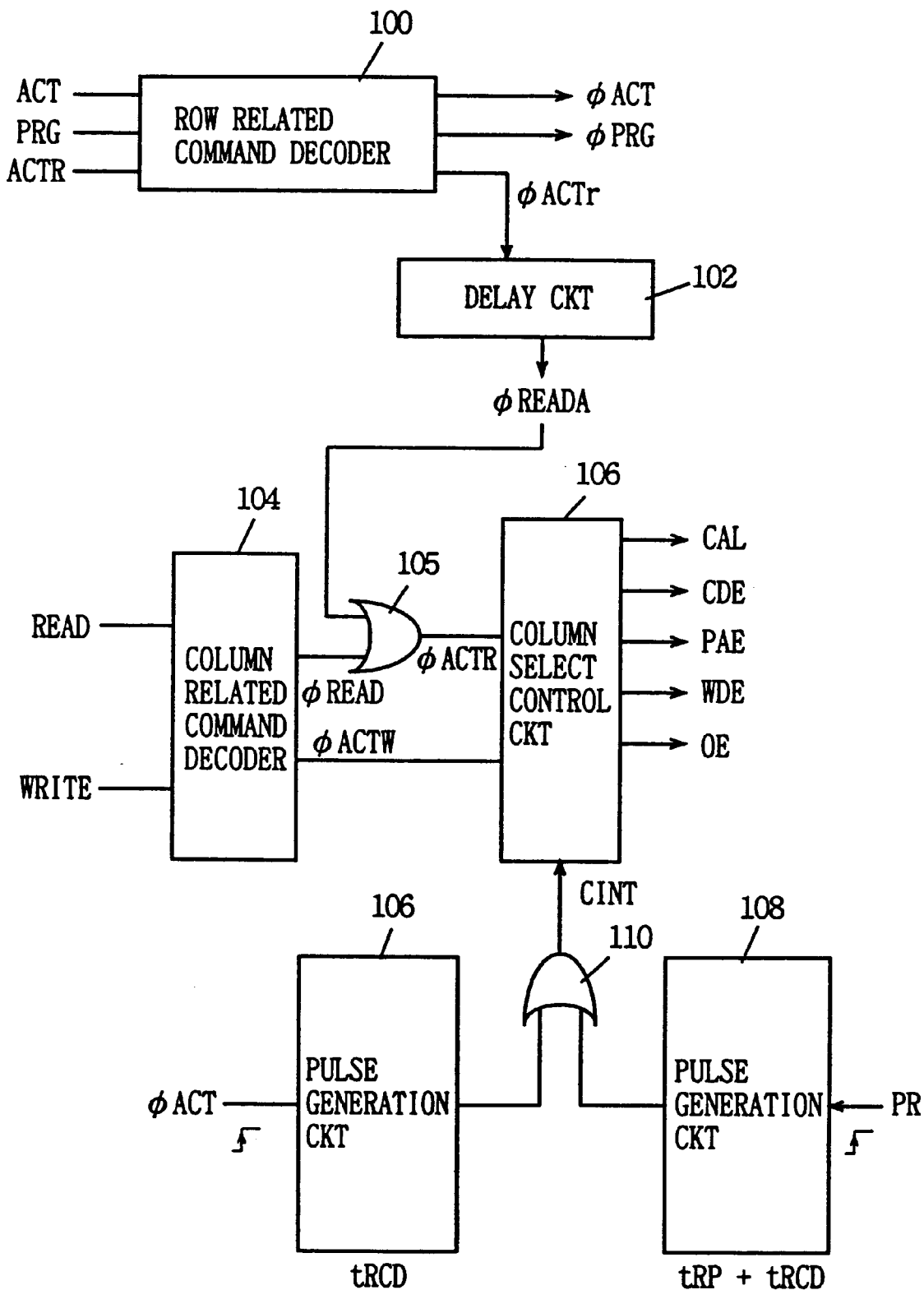
FIG. 17 is a diagram schematically showing the configuration of a column select portion in a semiconductor memory device according to a fourth embodiment of the invention.

FIG. 17 is a diagram showing a main part of a semiconductor memory device according to a fourth embodiment of the invention. In the configuration shown in FIG. 17, an active read command ACTR is newly used as a command related to a row selection. When active read command ACTR is applied, a row selecting operation and a column selecting operation are conducted serially. More specifically, active read command ACTR is a combination of read command READ and active command ACT.

In FIG. 17, row related command decoder 100 receives active command ACT, precharge command PRG and active read command ACTR, and outputs an array activation instruction signal φACT, a precharge operation instruction signal φPRG, and a reading operation activation signal φACTr. Array activation instruction signal φACT is activated when active command ACT or active read ACTR is applied. Active read command φACTr is activated only if active read command ACTR is applied.

This internal signal φACTr is applied to a column select control system through a delay circuit 102. Delay circuit 102 is formed of a counter counting a clock signal for example, delays signal φACTr for a prescribed time period (time period corresponding to RAS-CAS delay time), and outputs an internal read operation instruction signal φREADA.

The column select control circuitry includes a column related command decoder 104 for decoding a read command READ and a write command WRITE, an OR circuit 105 receiving internal read operation instruction signal φREAD from the column related command decoder and signal φREADA from delay circuit 102, and a column related select control circuit 106 for generating a control signal related to a column selecting operation in response to output signal φACTR from OR circuit 105 and an internal writing operation activation signal φACTW from column related command decoder 104.

Column select control circuit 106 sequentially activates a column address latch instruction signal CAL which gives a timing for latching a column address, a column decoder enable signal CDE enabling a column decoder, a preamplifier enable signal PAE enabling a preamplifier, a write driver enable signal WDE activating a writing circuit, and an output enable signal OE for activating an output buffer. Preamplifier enable signal PAE and output buffer enable signal OE are activated if internal reading operation activation signal φACTR is activated. Write driver enable signal WDE is activated if writing operation instruction signal φACTW is activated.

The column select control circuitry further includes a pulse generating circuit 106 for outputting a signal pulled to a high level for a fixed time period in response to a rising of array activation instruction signal φACT, a pulse generation circuit 108 for generating a pulse signal in response to a rising and a falling of signal PR, and an OR circuit 110 receiving output signals from pulse generation circuits 106 and 108. The width of a pulse output from pulse generation circuit 106 is RAS-CAS delay time period tRCD, which is active for substantially the same time period as the delay time of delay circuit 102. The pulse width of a pulse signal output from pulse generation circuit 108 is the sum of RAS precharge time period tRP and RAS-CAS delay time tRCD. An output signal from OR circuit 110 is applied to column select control circuit 106 as a column related prohibition signal CINT. Column select control circuit 106 has its operation prohibited if column prohibition signal CINT is at an H level.

Figure 18:
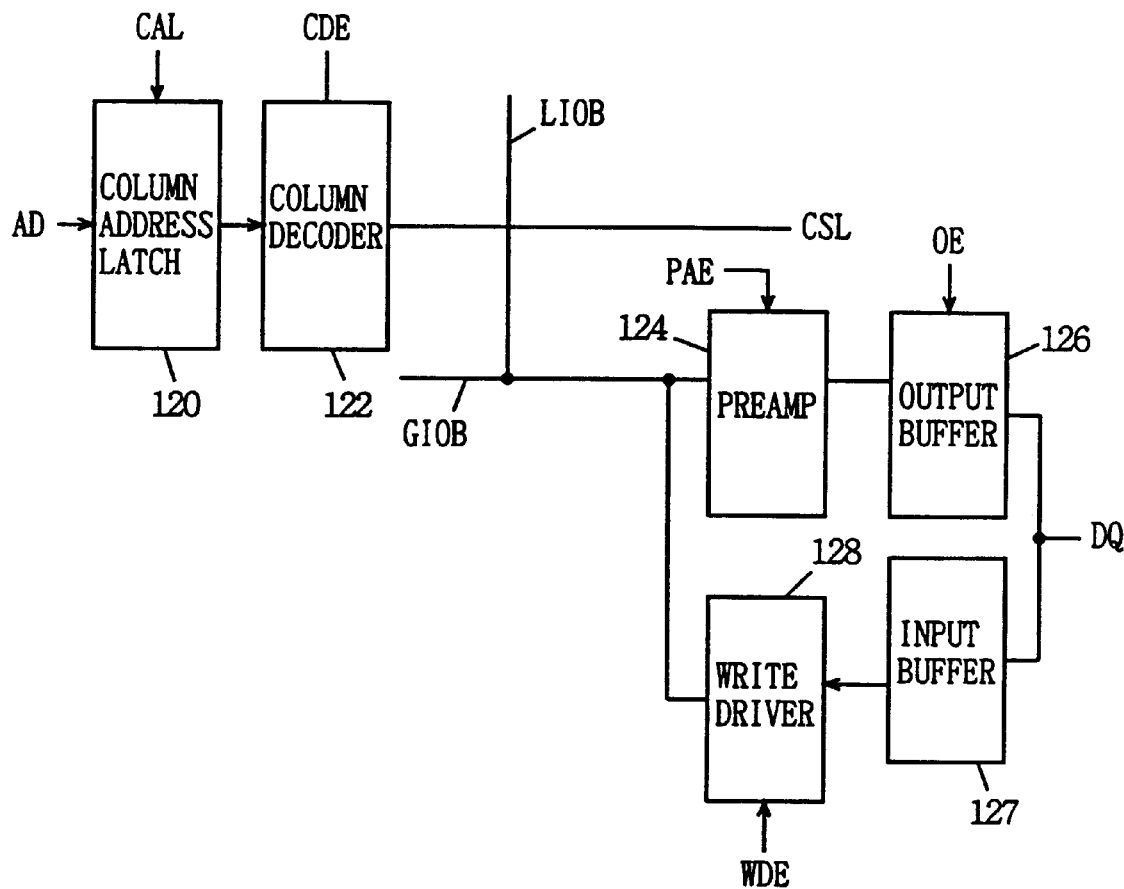
FIG. 18 is a diagram schematically showing the configuration of a data input/output portion in a semiconductor memory device according to the invention.

FIG. 18 is a diagram showing the configuration of a portion related to a column select operation in a semiconductor memory device according to the invention. In FIG. 18, a column address latch 120 incorporates and latches an applied address in response to column address latch instruction signal CAL, and generates an internal column address signal. A column decoder 122 is activated in response to column decoder enable signal CDE, decodes the internal column address signal applied from column address latch 120, and outputs a column select signal CSL based on the result of decoding.

As described in conjunction with the first embodiment, a local IO bus LIOB and a global IO bus GIOB are connected under the control of a control signal from the column select control circuit.

The data input/output circuitry includes a preamplifier 124 activated in response to activation of preamplifier enable signal PAE and amplifying data on global IO bus GIOB, an output buffer 126 activated in response to output buffer enable signal OE and buffering the data amplified by preamplifier 124 to generate output data Q, an input buffer 127 buffering externally applied write data D and generating internal write data, a write driver 128 amplifying the internal write data applied from input buffer 127 and transferring the data to global IO bus GIOB in response to activation of write driver enable signal WDE.

Figure 19:
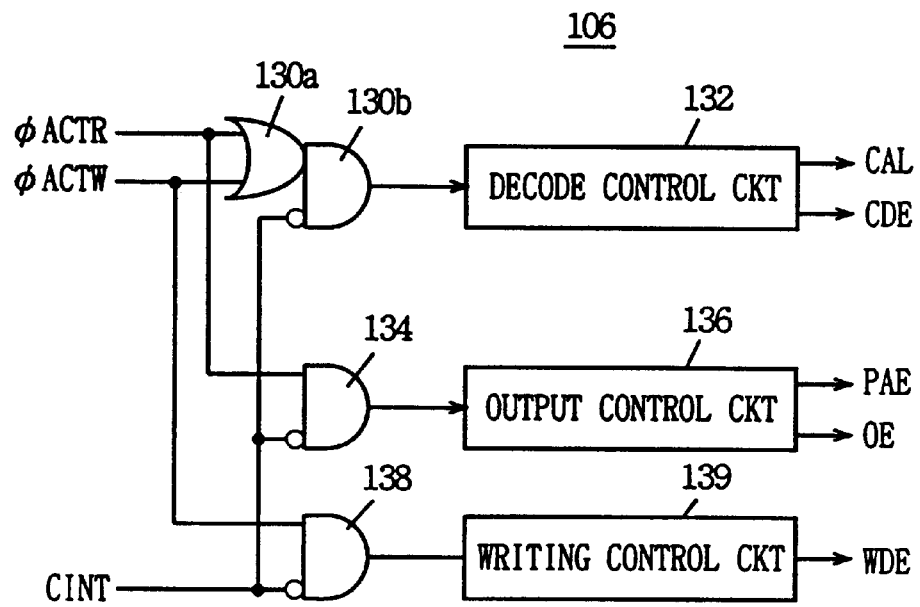
FIG. 19 is a diagram schematically showing the configuration of a column select control circuit shown in FIG. 17.

FIG. 19 is a diagram showing an example of the configuration of column select control circuit 106. In FIG. 19, column select control circuit 106 includes an OR gate 130a receiving internal reading operation instruction signal φACTR and internal writing operation instruction signal φACTW, a gate circuit 130b receiving an output signal from OR gate 130a and column prohibition signal CINT, a decode control circuit 132 outputting column address latch instruction signal CAL and column decoder enable signal CDE in response to an activation of an output signal from gate circuit 130b, a gate circuit 134 receiving internal reading operation instruction signal φACTR and column prohibition signal CINT, an output control circuit 136 activating preamplifier enable signal PAE and output buffer enable signal OE for a prescribed time period in response to a rising of an output signal from gate circuit 134, a gate circuit 138 receiving internal writing operation instruction signal φACTW and column prohibition signal CINT, and a write control circuit 139 for activating write driver enable signal WDE in a prescribed timing for a prescribed time period in response to an activation of an output signal from gate circuit 138.

Gate circuits 130b, 134 and 138 are disabled in response to column prohibition signal CINT being at an H level and output an L level signal. Internal reading operation instruction signal φACTR and internal writing operation instruction signal φACTW circuit may be generated from respective set/reset flipflops. These set/reset flipflops may be reset in response to precharge signal φPRG. As shown in FIG. 9, as column prohibition signal CINT (see FIG. 17) is in an active state (at an H level), column select control circuit 106 is prohibited from operating, a column select operation and a data writing/reading operation before sensing and amplification by a data amplifier are prohibited.

Figure 20A:
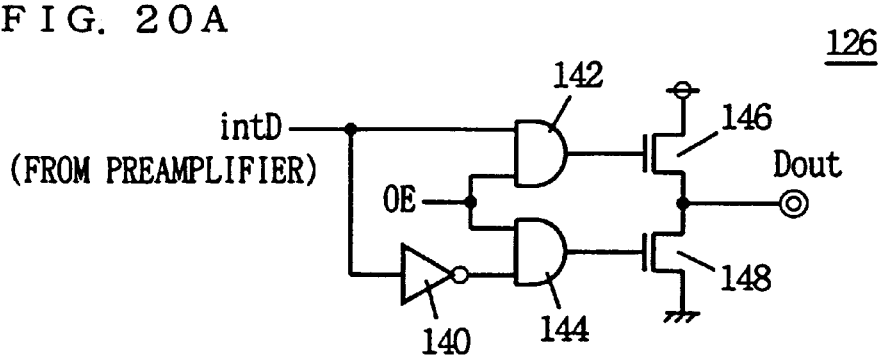
FIG. 20A is a diagram schematically showing the configuration of an output buffer in FIG. 18.

FIG. 20A is an example of the configuration of output buffer 126 for one bit data. In FIG. 20A, output buffer 126 includes an inverter 140 receiving internal read data intD read out from a preamplifier, an AND circuit 142 receiving internal read data intD and output buffer enable signal OE, an AND circuit 144 receiving output buffer enable signal OE and an output signal from inverter 140, an n channel MOS transistor 146 which conducts when the output signal of AND circuit 142 is at an H level and outputs a signal at a power supply voltage level as read data Dout(Q), and an n channel MOS transistor 148 which conducts when the output signal of AND circuit 144 is at an H level and outputs a signal at a ground voltage level as read data Dout(Q).

When output buffer enable signal OE is at an L level, AND circuits 142 and 144 both generate an L level output signal, MOS transistors 145 and 148 are both in a non-conductive state, and read data Dout is an output impedance state. If output buffer enable signal OE is pulled to an H level, AND circuits 142 and 144 operate as a buffer, and read data Dout corresponding to internal read data intD is externally output.

Figure 20B:
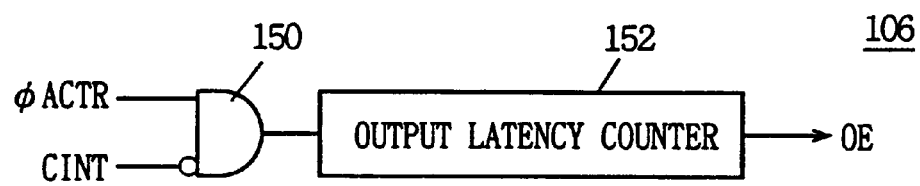
FIG. 20B is a diagram schematically showing the configuration of an output control circuit in FIG. 19.

FIG. 20B is a diagram showing the configuration of an output buffer enable signal generation portion. The output buffer enable signal generation portion is included in column select control circuit 106 shown in FIG. 17. In FIG. 20B, the output buffer enable signal generation portion includes a gate circuit 150 receiving internal reading operation activation signal φACTR and column prohibition signal CINT and an output latency counter 152 counting in response to a rising of an output signal from gate circuit 150 and generating output enable signal OE which attains an H level after the elapse of a prescribed time period. Output latency counter 152 pulls output buffer enable signal OE to an H level during a burst length time period which is preset or defined by a command.

Internal reading operation activation signal φACTR is, as shown in FIG. 17, pulled to an H level of active state if read command READ or active read command ACTR is applied. A sense amplifier confliction detection signal PR is kept at an H level for a prescribed time period (tRP) if a confliction for a sense amplifier is generated. During the period, gate circuit 150 outputs an L level signal. Note that column select control circuit 106 shown in FIG. 17 starts internal operation after column prohibition signal CINT is pulled to an L level. A read command or a write command is usually applied after elapse of RAS-CAS delay time tRCD. A following active command is applied after the elapse of the RAS precharge time period. Therefore, in a usual operation, output latency counter 152 starts counting in response to activation of internal reading operation activation signal φACTR and inactivation of column prohibition signal CINT (in which case sense amplifier band confliction detecting signal PR is at an L level). Meanwhile, if a confliction for a sense amplifier band is caused, output latency counter 152 starts counting after the confliction for the sense amplifier completes and then column prohibition signal CINT is inactivated. Herein internal reading operation instruction (activation) signal φACTR is supposed to be maintained at an H level during the reading operation time period. Output buffer enable signal OE therefore accurately gives a timing for outputting read data from the semiconductor memory device.

Figure 21:
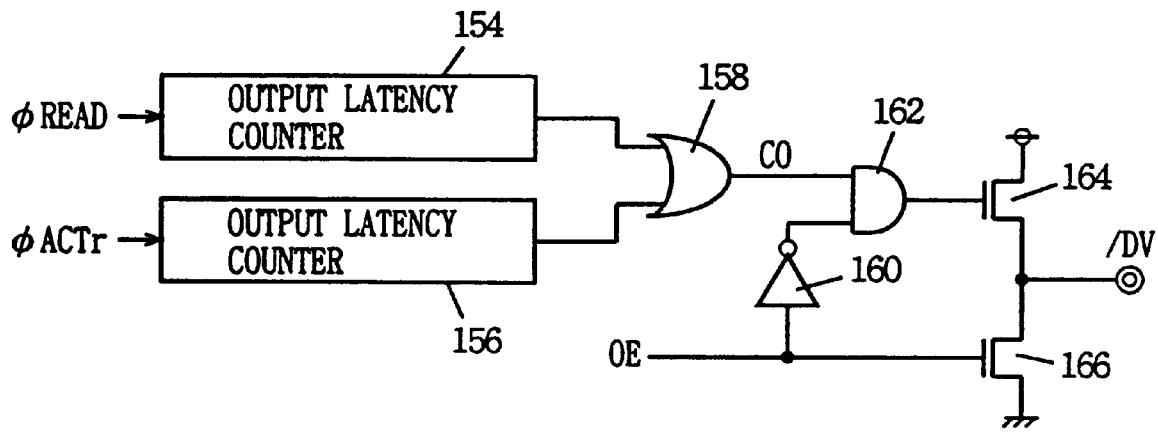
FIG. 21 is a diagram schematically showing the configuration of a main portion of a data memory device according to the fourth embodiment of the invention.

FIG. 21 is a diagram showing the configuration of a valid data signal output portion used in the fourth embodiment. The valid data signal output portion surely indicates that data requested by an external device (processor) is output if a confliction for a sense amplifier is caused or in a usual operation mode.

In FIG. 21, the valid data signal output portion includes an output latency counter 154 starting counting in response to activation of reading operation instruction signal φREAD shown in FIG. 17, a latency counter 159 staring counting in response to activation of active read command detection signal φACTr, an OR circuit 158 receiving output signals from output latency counters 154 and 156, an inverter 160 receiving output buffer enable signal OE, an AND circuit 162 receiving an output signal from inverter 160 and an output signal from OR circuit 158, an n channel MOS transistor 164 conducting if an output signal from AND circuit 162 is at an H level and driving data valid signal /DV to an H level of power supply voltage level, and an n channel MOS transistor 166 conducting if output buffer enable signal OE is at an H level and discharging data valid signal /DV to a ground potential level.

Output latency counter 154 counts a latency time period the same as that counted by output latency counter 152 shown in FIG. 20B. Meanwhile, output latency counter 156 counts a latency time period produced as the sum of the latency time periods of output latency counters 162 and 154 and a delay time period by delay time circuit 102 shown in FIG. 17. OR circuit 158 outputs a signal CO according to a predetermined latency time period during which valid data is output after a read command or an active read command is applied. Therefore, if there is a confliction for a sense amplifier band, in other words, if an active read command is applied, and signal CO is pulled to an H level after the elapse of the predetermined latency time period, there are some cases in which the valid data is not output. The processor outside the device is therefore accurately notified that the requested data will be output, using data valid signal /DV.

Figure 22:
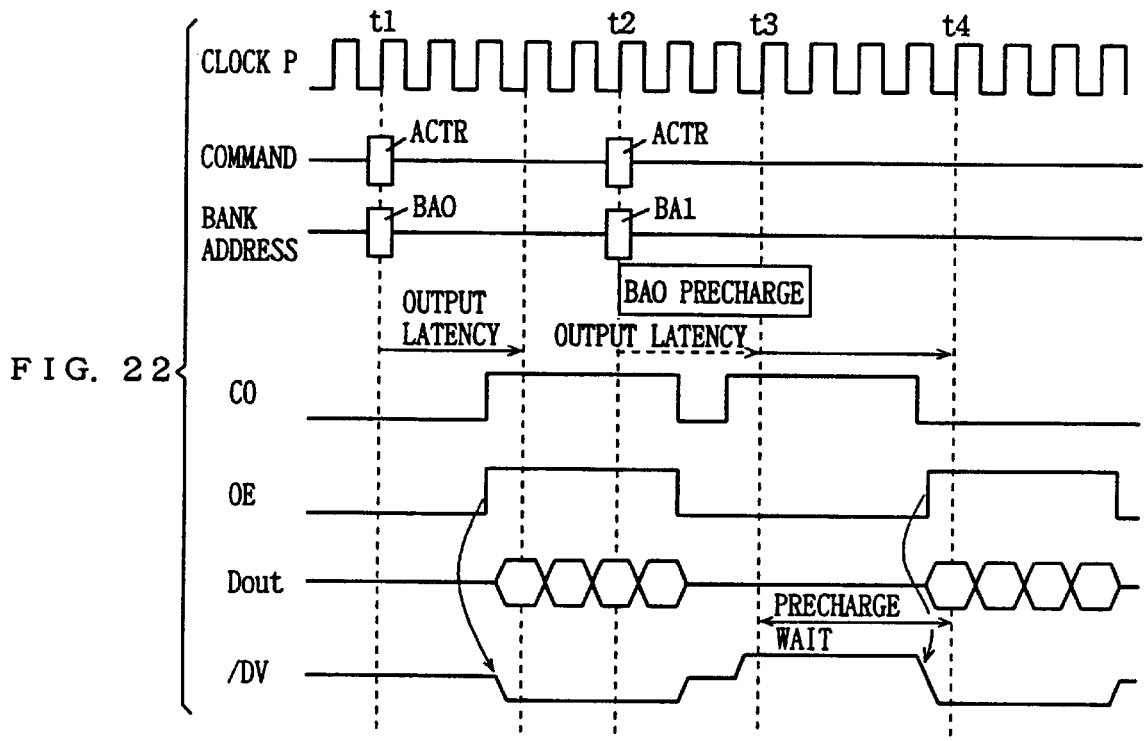
FIG. 22 is a timing chart for use in illustration of the operation of circuits shown in FIGS. 20 and 21.

FIG. 22 is a timing chart for use in illustration of the operations of the output buffer and the data valid signal output portion shown in FIGS. 20 and 21. Referring to FIG. 22, the sequence of outputting the data valid signal will be described. FIG. 22 shows an operation when an active read command ACTR is applied.

At time t1, active read command ACTR is applied to a bank BA0 (memory block MB#0). According to active read command ACTR, memory block MB#0 specified by bank address BA0 is accessed. According to the active read command, an internal active read instruction signal φACTr is activated an output latency counter 165 shown in FIG. 21 starts counting, and after the elapse of a prescribed time period, a signal CO from OR circuit 158 is pulled to an H level. If there is no confliction generated for sense amplifier band, signal PR is at an L level, and signal CINT is also at an L level. Therefore, output latency counter 152 shown in FIG. 20B executes a counting operation in response to internal reading operation instruction signal φACTR, and outputs an output buffer enable signal OE after the elapse of a prescribed time period.

The latency time period of output latency counter 156 is the same as the delay period of output latency counter 152 and the delay period of delay circuit 102. Therefore, signals CO and OE are pulled to an H level substantially in the same period. If signals CO and OE are both at an L level, MOS transistors 164 and 166 shown in FIG. 21 are both in a non-conduction state and data valid signal /DV is in a high impedance state. If output buffer enable signal OE attains an H level, MOS transistor 166 shown in FIG. 21 conducts, while MOS transistor 164 is in non-conduction state and data valid signal /DV is driven to an L level, ground potential level. Thus, the processor outside the device is notified that valid data will be output.

Output buffer enable signal OE is at an H level during a period usually called "burst length", during which data is sequentially output in synchronization with a clock signal P. Active read command ACTR does not instruct a precharge operation. Memory block MB#0 is therefore in an active state. In this state, at time t2, active read command ACTR is applied in response to bank address BA1. It is however assumed that the time period between time t1 and t2 is set to a period with no confliction of read data. Therefore, necessary data is sequentially read out from memory block MB#0 specified by bank address BA0. Signals CO and OE attain an L level after the elapse of the specified burst length period, and output data Dout and data valid signal /DV both attain a high impedance state.

At time t2, with memory block MB#0 being in an active state, active read command ACTR is applied together with bank address BA1. Bank address BA1 specifies memory block MB#1 sharing sense amplifier band SA#1 with memory block MB#0. In this state, a memory block MB#0 is precharged as described above. After precharging of memory block MB#0 specified by bank address BA0 completes, a memory block specified by bank address BA1 is activated. Outside the device, the presence of confliction for the sense amplifier band is not recognized (though it is possible to know by a command input prohibition signal in the period shown in FIG. 16) and it cannot be determined if the valid data will be output after the elapse of a predetermined latency.

In this case, in response to an active read command, the output signal of output latency counter 156 shown in FIG. 21 attains an H level and signal CO attains an H level after the elapse of a prescribed time period accordingly. In the period, however, sense amplifier confliction detecting signal PR is at an H level for a prescribed time period, output buffer enable signal OE from output latency counter 152 maintains its L level through column prohibition signal CINT. In this state, as shown in FIG. 21, MOS transistor 166 is in a non-conductive state while MOS transistor 164 conducts in response to a rising of signal CO, and data valid signal /DV is pulled to an H level. An external processor monitors that data valid signal /DV is at the H level and recognizes that the valid data is not output because of the confliction for the sense amplifier band (precharge wait state).

If the precharge of the memory block MB#0 specified by bank address BA0 completes, memory block MB#1 specified by bank address BA1 is activated and column select operation is executed, output buffer enable signal OE from output latency counter 152 shown in FIG. 20B attains an H level, and the valid data is output at time t4. When output buffer enable signal OE attains the H level, MOS transistor 166 in FIG. 21 conducts, and data valid signal /DV is pulled to an L level. Therefore, the processor outside the memory device can recognize that the valid data will be output, by monitoring data valid signal /DV. Thus, the processor outside the memory device can accurately take in necessary data even if there is a confliction for a sense amplifier band.

No such confliction for a sense amplifier band is generated if a read command is applied. In the case, output latency counter 152 in FIG. 20B and output latency counter 154 in FIG. 21 operate substantially in the same timing, and therefore, output buffer enable signal OE and signal CO are pulled to an H level of active state in substantially the same timing. Therefore, if a read command is applied, output of valid data can accurately be recognized.

Note that in the above fourth embodiment, data valid signal /DV is pulled to an L level when data (expected data) requested by the processor is output, and to an H level in the precharge wait state due to a confliction to a sense amplifier band, but conversely signal /DV may be pulled to an L level in the precharge wait sate, while signal /DV may attain an H level during the period in which the expected data is output. Valid data signal /DV is in a high impedance state in a stand-by state (during the period other than when the data output period indicated by latency and the data output period in practice), and the high impedance state does not indicate the validity/invalidity of data.

As described above, in the fourth embodiment, the provision of data valid signal output portion makes it sure that an external device can take in necessary data even if there is a confliction for a sense amplifier band within a semiconductor memory device.

[Fifth Embodiment]

Figure 23:
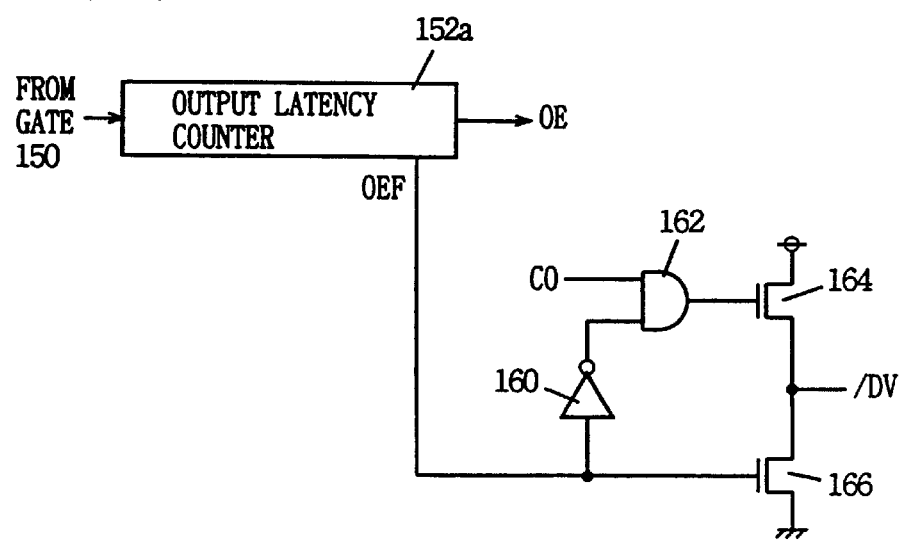
FIG. 23 is a diagram showing the configuration of a valid data signal output portion according to a fifth embodiment of the invention.

FIG. 23 is a diagram showing the configuration of a data valid signal output portion in a semiconductor memory device according to a fifth embodiment of the invention. In FIG. 23, an output latency counter 152a outputs a data valid enable signal OEF in a timing earlier than that of output buffer enable signal OE by 1 to 2 clock cycle periods. Data valid enable signal OEF is applied to inverter 160 and MOS transistor 166. The other configuration is the same as that shown in FIG. 21.

Figure 24:
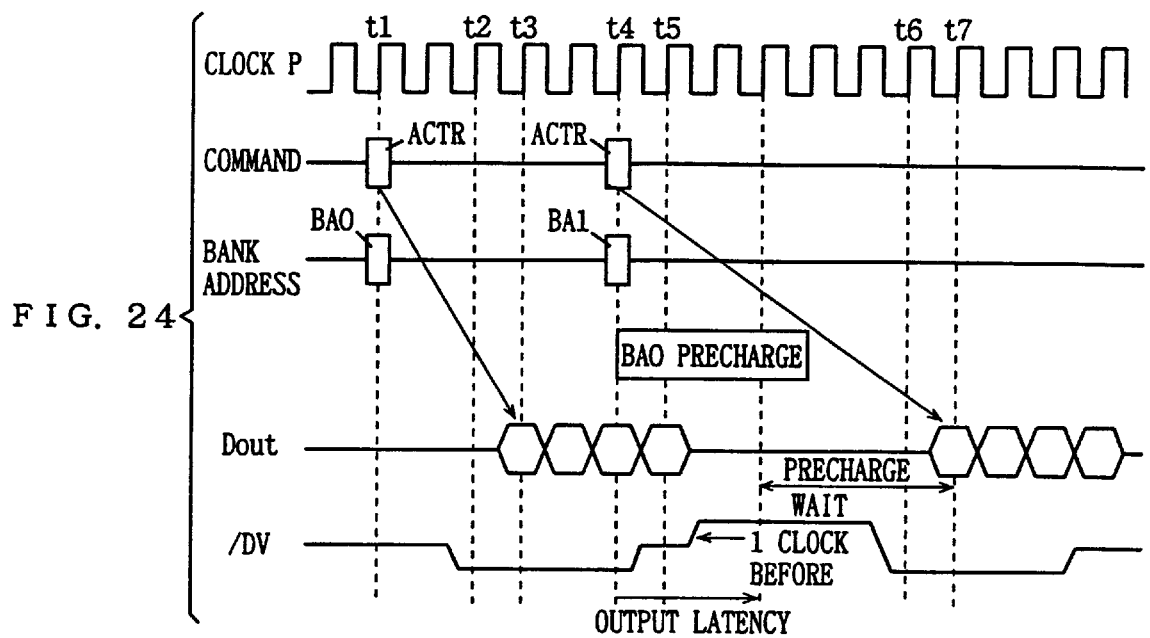
FIG. 24 is a timing chart for use in illustration of the operation of the circuit shown in FIG. 23.

FIG. 24 is a timing chart for use in illustration of the operation of the data valid signal output portion. At time t1, bank address BA and active read command ACTR are applied. This is the case with a usual operation, and there is no confliction for a sense amplifier. In this state, at time t3 and after, valid data is output according to output buffer enable signal OE. Data valid enable signal OEF is activated in a timing earlier than output buffer enable signal OE by 1 clock cycle, and data valid signal /DV is pulled to an L level accordingly. After the elapse of a burst length time period, at time t4, data valid signal /DV is pulled to a high impedance state. At the following time t5, valid data is output. An external processor detects the number of pieces of data to be read according to the burst length, and therefore can take in valid data from next clock cycle if valid data signal /DV is activated. Therefore, after the elapse of one clock cycle since the output of valid data is notified with the signal /DV, the processor can take in valid data with a time margin for taking the data being provided, and therefore, the external device may accurately take in valid data.

At time t4, if active read command ACTR and bank address BA1 are applied, memory block MB#0 specified by bank address BA0 is inactivated, because there is a confliction for a sense amplifier band. In this case, during the period in which valid data is to be output, no such data to be output is prepared, and therefore signal OE is still at an L level (output latency counter 152a has not completed its count up operation), and valid data signal /DV is driven to an H level by MOS transistor 164. Thus, the external device can recognize that the bank is being precharged because of a confliction for the sense amplifier band and maintains the wait state.

If the precharging of the conflicting bank is completed, a bank to be accessed attains a selected state and necessary data is read out, enable signal OEF attains an H level, and valid data signal /DV attains an L level at time t6. In clock cycles subsequently starting from time t7, valid data is sequentially output.

Thus, one or more cycles before, data signal /DV is activated, and therefore the external device can accurately take valid data with a margin.

Figure 25:
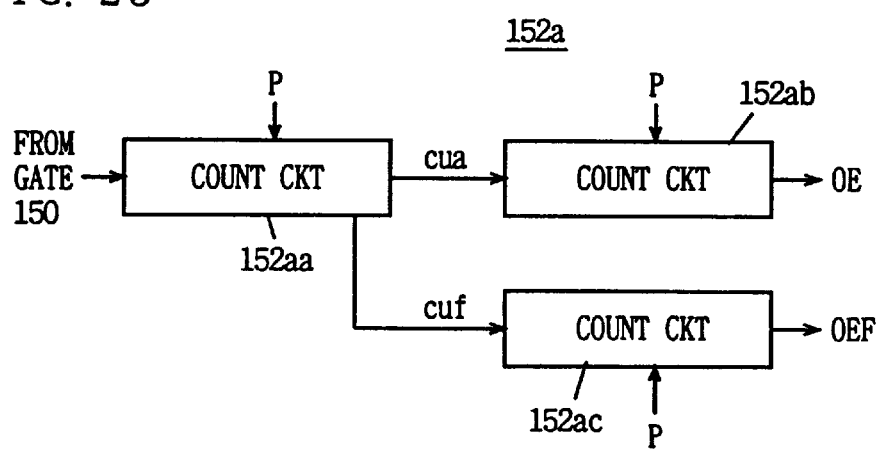
FIG. 25 is a diagram schematically showing another configuration of the data valid signal output portion according to the fifth embodiment of the invention.

FIG. 25 is a diagram schematically showing the configuration of output latency counter 152a shown in FIG. 23. In FIG. 25, output latency counter 152a includes a count circuit 152aa activated in response to a signal applied from gate circuit 150 shown in FIG. 20B and counting a clock signal P, a count circuit 152ab activated in response to a count up signal cua from count circuit 152aa and counting clock signal P to maintain output buffer enable signal OE at an H level until the count value reaches a prescribed value, and a count circuit 152ac activated in response to a count up signal cuf from count circuit 152aa and counting clock signal P to keep driving enable signal OEF to an H level until the count value reaches a prescribed value.

The number of clock cycles counted by count circuit 152aa is that defined by output latency, and the number of clock cycles counted by count circuits 152ab and 152ac is the number of clock cycles defined by a burst length. Count circuits 152ab and 152ac therefore drive the signals OE and OEF during clock cycles period defined by the burst length to an H level in response to the count up instruction signal from count circuit 152aa. Count up signal cuf output from count circuit 152ac needs only be activated in a timing (clock cycle) earlier than count up signal cua activated after the elapse of the output latency.

As described above, in the fifth embodiment of the invention, the data valid signal is activated in a cycle earlier than the clock cycle in which the valid data is output, and the external device can take in the valid data with a margin.

[Sixth Embodiment]

Figure 26:
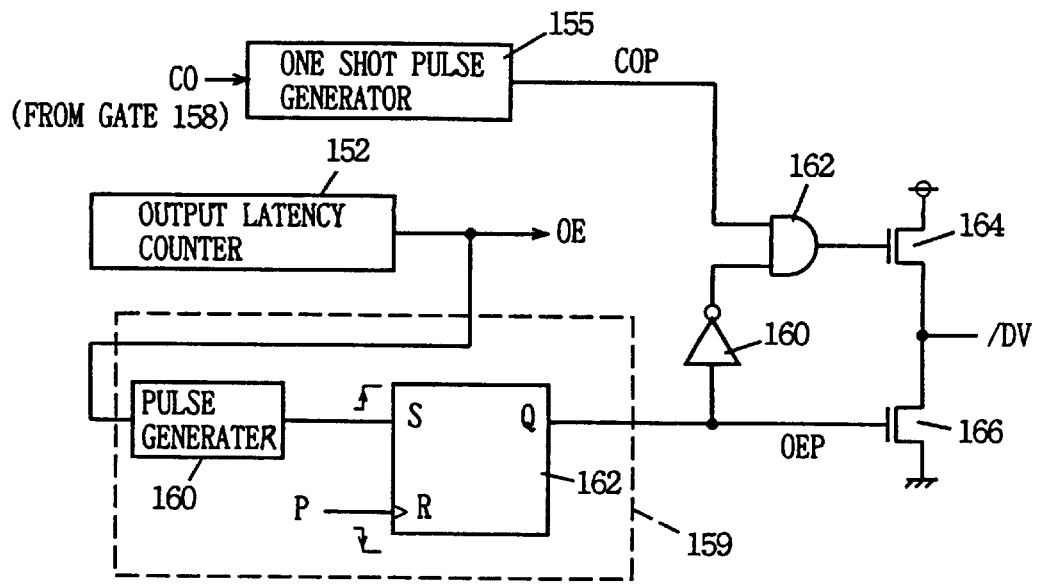
FIG. 26 is a diagram schematically showing the configuration of a data valid signal output portion according to a sixth embodiment of the invention.

FIG. 26 is a diagram schematically showing the configuration of a valid data output portion according to a sixth embodiment of the invention. The configuration shown in FIG. 26 includes a one shot pulse generator 155 for generating a one shot pulse COP in response to signal CO from gate 158 shown in FIG. 21 and a one shot pulse generator 159 generating a one shot pulse OEP in reopens to output buffer enable signal OE from output latency counter 152. One shot pulse generators 155 and 159 have the same configuration. In FIG. 26, the structure of one shot pulse generator 159 is shown by way of illustration.

One shot pulse generator 159 includes a pulse generation circuit 160 for generating a pulse signal with a prescribed time width in response to output buffer enable signal OE and a set/reset flipflop 162 which is set in response to a rising of the pulse signal from pulse generation circuit 160 and reset in response to a falling of clock signal P. A pulse signal OEP is output from the output Q of flipflop 162. Pulse signal COP is aplied to one input of AND circuit 162, which receives pulse signal OEP at its other input through inverter 160. Pulse signal OEP is also aplied to the gate of MOS transistor 166. MOS transistor 164 receives the output signal of AND circuit 162 at a gate thereof.

Figure 27:
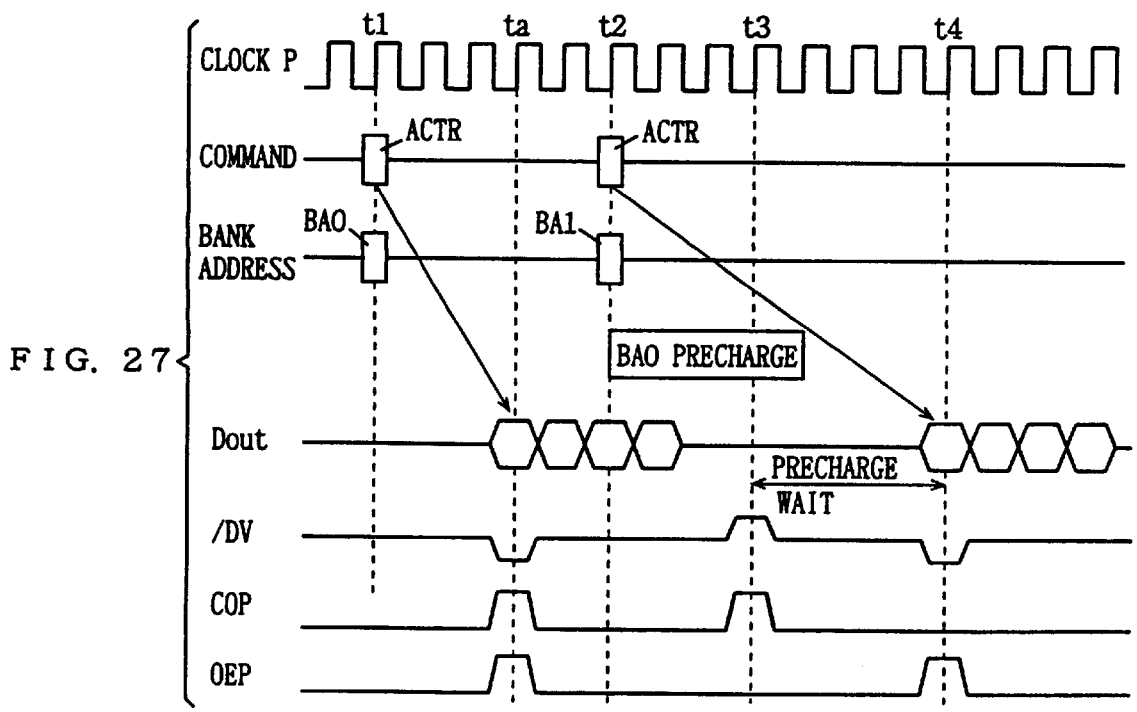
FIG. 27 is a timing chart for use in illustration of the operation of the data valid signal output portion shown in FIG. 26.

FIG. 27 is a timing chart for use in illustration of the operation of the valid data signal output portion shown in FIG. 26. Also in the operation sequence shown in FIG. 27, assume that if active read command ACTR and bank address BA0 are applied at time t1, a usual accessing operation is executed, while if bank address BA1 and active read command ACTR are applied at time t2, there is a confliction for a sense amplifier band. In this case, in response to command ACTR applied at time t1, a memory bank (memory block) is activated and a memory cell is selected, and at time ta pulse signals COP and OEP rise to an H level. In this state, MOS transistor 66 conducts, and data valid signal /DV falls to an L level.

Meanwhile, in the case of the active read command being aplied at time t2, since there is a confliction for a sense amplifier band, a memory block specified by bank address BA0 is precharged. In the case, at time t3, pulse signal COP from one shot pulse generator 155 is pulled to an H level. Meanwhile since pulse signal OEP is at an L level, the output signal of AND circuit 162 is pulled to an H level, MOS transistor 164 conducts, and data valid signal /DV attains an H level.

At time t4, if an accessing operation is executed and valid data is output in response to active read command ACTR and bank address BA1, pulse signal OEP attains an H level, MOS transistor 66 conducts, and data valid signal /DV attains an L level.

As shown in FIG. 27, if data valid signal /DV is output in the form of a one shot pulse, the data valid signal is at one of H level, L level and high impedance state, and can indicate that the validity/invalidity of data and a stand-by state. The external device previously recognizes the number of pieces of data to be read based on burst length data.

Note that in the configuration shown in FIG. 26, data valid signal /DV is pulled to an L level in the form of a one shot pulse in the clock cycle in which the valid data is output. In this case, pulse signal OEP may be activated in a cycle prior to the clock cycle in which the valid data is output. Similarly, pulse signal COP is generated in the same clock cycle as pulse signal OEP. One clock cycle before the elapse of a predetermined number of clock cycles of latency, data valid signal IDV attains an H level. Therefore, the validity/invalidity of data can be always recognized one or more clock cycles before than taking in the data, the timing for determining the validity/invalidity of data may be the same, which alleviates the load imposed on the external device.

[Seventh Embodiment]

Figure 28:
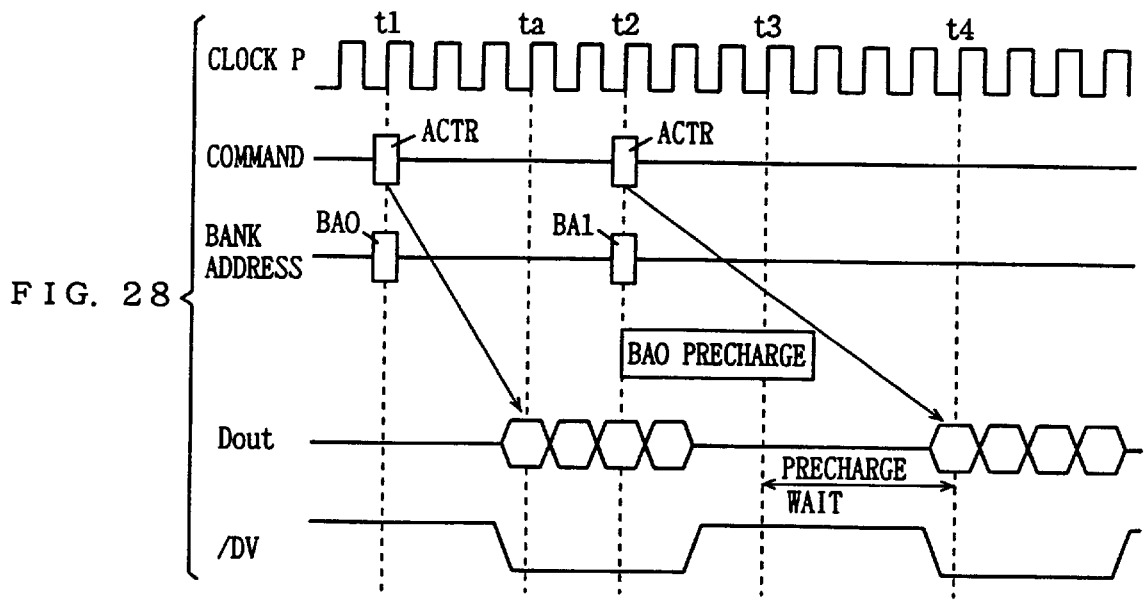
FIG. 28 is a timing chart for use in illustration of the operation of a data valid signal output portion according to a seventh embodiment of the invention.

FIG. 28 is a timing chart for use in illustration of a sequence of outputting a data valid signal according to a seventh embodiment of the invention. In the timing chart shown in FIG. 28, data valid signal /DV attains an H level in a stand-by state, and attains an L level when the valid data is output. Note that the operation sequence is the same as that described in conjunction with the foregoing embodiment. More specifically, data valid signal /DV attains an H level if valid data is not output. Meanwhile, if valid data is output at time t2 in response to active read command ACTR applied at time t1, data valid signal /DV attains an L level. If active read command ACTR is once again applied at time t2, valid data is output at time t4 and valid data is not output at time t3 because of a predetermined output latency, data valid signal /DV is maintained at an H level at time t3, and attains an L level at time of outputting the valid data at time t4 and after.

If data valid signal /DV is brought into a binary state including H and L level, the present configuration may be applied to a processing system with a high speed interface such as GTL (gunning transceiver logic).

Figure 29:
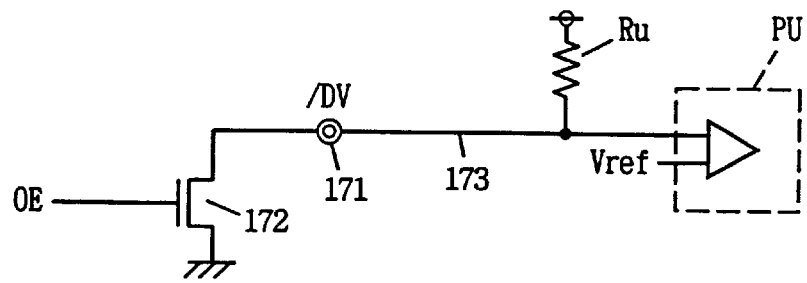
FIG. 29 is a diagram schematically showing the configuration of a data valid signal output portion implementing the operation timing in FIG. 28.

FIG. 29 is a diagram showing the configuration of a valid data signal output portion for generating data valid signal /DV shown in FIG. 28. In FIG. 29, the valid signal output portion includes an n channel MOS transistor 172 conducting in response to output buffer enable signal OE and driving output node 171 to an L level. Output node 171 is coupled to a processor PU through a signal line 173. Signal line 173 is connected with a pull-up resistor Ru. Processor PU has at its input buffer portion a comparator for input signal level determination which compares a reference voltage Vref and a potential on signal line 173. In a stand-by state, in other words if valid data is not output, output buffer enable signal OE is at an L level, and MOS transistor 173 is in an off state.

In this state, signal line 173 is driven to an H level by the function of pull-up resistor Ru. Meanwhile, if valid data is output, output buffer enable signal OE attains an H level, MOS transistor 172 conducts, and signal line 173 is driven to an L level. Thus, data valid signal /DV can be output in the form of a binary signal.

Figure 30:
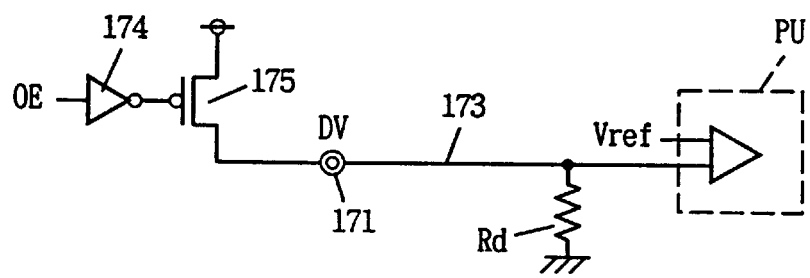
FIG. 30 is a diagram schematically showing the configuration of a variation of the data valid signal output portion according to the invention.

FIG. 30 is a diagram showing the configuration of a variation of the seventh embodiment of the present invention. In FIG. 30, the data valid signal output portion includes an inverter 174 for inverting output buffer enable signal OE, and a P-channel MOS transistor 175 conducting with the output signal of inverter 174 being at an L level and driving the output node 171 to the power supply potential level. Output node 171 is coupled to processor PU through a signal line 173. Signal line 173 is provided with a pull-down resistor Rd. The input buffer of processor PU determines the logical level of an input signal by comparing reference voltage Vref and the potential on signal line 173.

In a stand-by state, in other words if valid data is not output, output buffer enable signal OE is at an L level, and the output signal of inverter 174 is at an H level. MOS transistor 175 is therefore in an non-conductive state, and node 171 and signal line 173 are driven to an L level of ground potential level by the function of pull-down resistor Rd. Meanwhile, if valid data is output, output buffer enable signal OE attains an H level, and an output signal from inverter 174 attains an L level accordingly, thus conducting MOS transistor 175. Thus, data valid signal DV transferred onto signal line 173 attains an H level. Therefore, in the configuration shown in FIG. 30, data valid signal DV attaining an L level in a stand-by state, and an H level at the time of outputting output data is generated and if valid data is output or not can be known based on the binary level.

Note that in the configurations shown in FIGS. 29 and 30, the data valid signal may be determined being in a valid data output instruction state in a clock cycle before the valid data is output. In addition, MOS transistors 172 and 175 may drive signal line 173 to an L level or an H level in the form of one shot pulse.

As described above, in the seventh embodiment, the binary level data valid signal is output, and therefore in a processing system using a high speed interface a processor outside the device can be notified of the exact time at which valid data is output, so that the external device can accurately take in the valid data.

[Eighth Embodiment]

Figure 31:
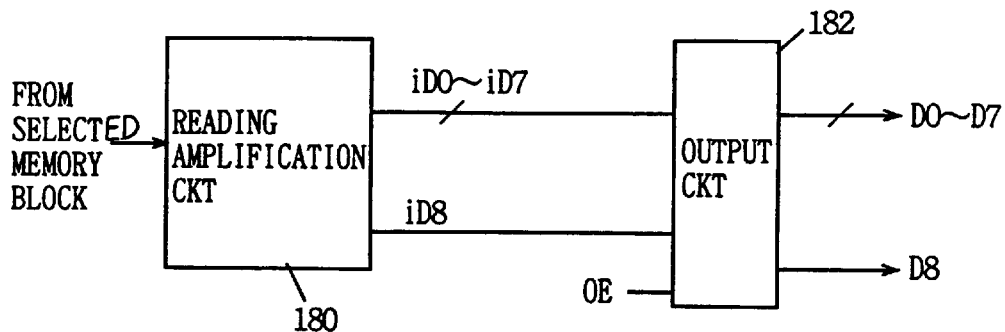
FIG. 31 is a diagram schematically showing the configuration of a data valid signal output portion according to an eighth embodiment of the invention.

FIG. 31 is a diagram showing the configuration of a data output portion according to an eighth embodiment of the invention. In FIG. 31, the data output portion includes a read amplification circuit 180 for amplifying in parallel 9-bit data read output from a selected memory block, and an output circuit 182 outputting internal read data iD0 to iD7 and iD8 read out from read amplification circuit 180 in response to output buffer enable signal OE. S Internal read data iD8 is a parity bit. Therefore, parity bit D8 is output externally in parallel with valid data D0 to D7.

Figure 32:
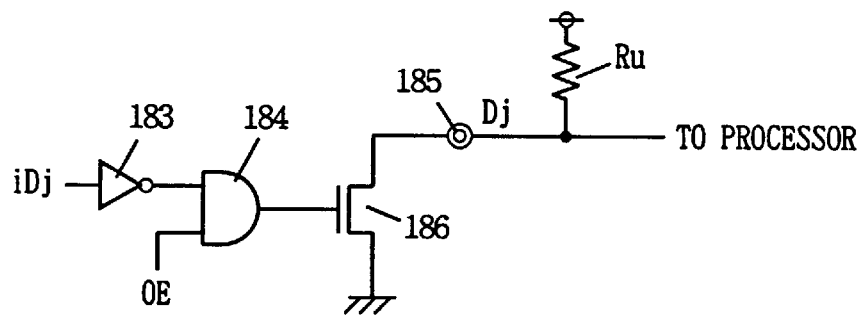
FIG. 32 is a diagram showing the configuration of a 1-bit portion in the output circuit shown in FIG. 31.

FIG. 32 is a diagram showing the configuration of an output buffer corresponding to one bit data included in output circuit 180. In FIG. 32, the output buffer includes an inverter 183 receiving internal read data iDj, an AND circuit 184 receiving an output signal of inverter 183 and output buffer enable signal OE, and an n channel MOS transistor 186 responding to the output signal of AND circuit 184 and driving output node 185 to a ground potential level. Read data Dj is output to node 185 for application to a processor. Output node 185 is coupled with pull-up resistor Ru. The parity bit is assumed to be determined such that the number of bits of data D0 to D8 at an H level is an even number in a normal state.

In a stand-by state, output buffer enable signal OEP is at an L level, MOS transistor 186 is in a non-conduction state and output node 185 is pulled to an H level by the function of pull-up resistor Ru. Therefore, data D0 to D7 and parity bit D8 are all brought to an H level, and the number of data bits at an H level is an even number. The processor monitoring the number determines that such a parity error state is attained and valid data is not read out. If valid data is output, data D0 to D8 change to an H level or an L level based on internal read data. In this state, since there is no parity error generated, the processor determines that valid data is output.

Figure 33:
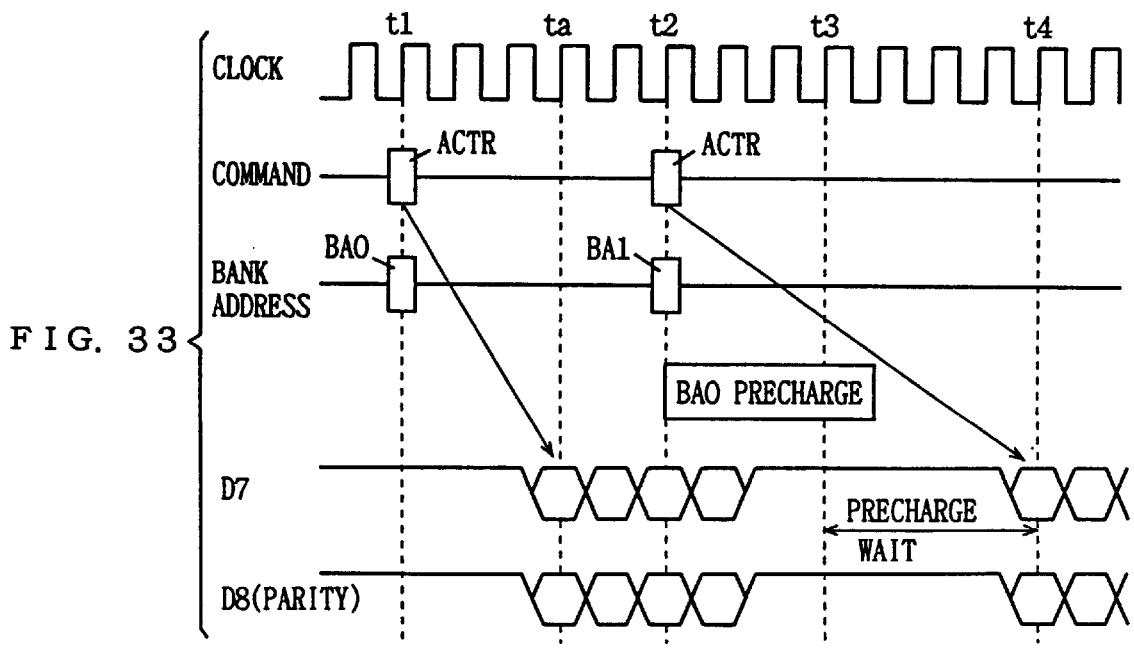
FIG. 33 is a timing chart for use in illustration of the operation of the output circuit shown in FIG. 31.

FIG. 33 is a timing chart for use in illustration of a sequence of reading data according to the eighth embodiment. Now referring to FIG. 33, the data output sequence will be detailed. If at time t1 active read command ACTR and bank address BA0 are applied, the data D0 to D7 and parity data D8 are all at an H level until valid data is output at time ta. The processor determines the state to be a parity error state in which valid data is not output. If at time ta, output buffer enable signal OE is activated and valid data is output, data output D0 to D8 change according to internal read data iD0 to iD8, respectively. Therefore, in this state, the parity is accurately determined, and therefore, the processor determines that the valid data is output. However, in a stand-by state, in other words if valid data is not output data D0 through D8 are all set to a state indicating a parity error state, and if valid data is output, the parity error is canceled. More specifically, if at time t2, bank address BA1 and active read command ACTR are applied and at time t3, valid data is not output, data D0 to D8 are all at an H level in a parity error state. The processor therefore does not take in data in this state. If at time t4 valid data is output, the parity error is canceled (internal read data is normal data), the processor determines that valid data is output and starts taking in the data.

Figure 34:
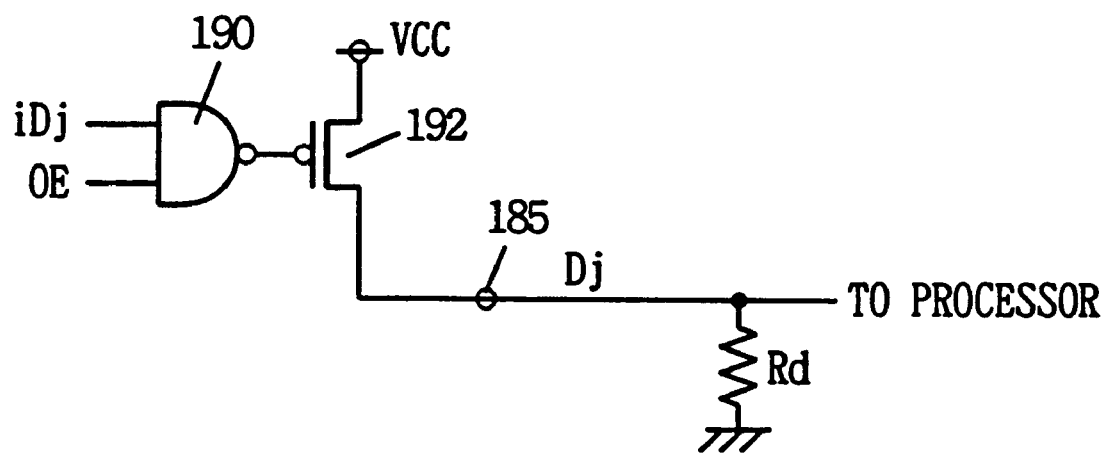
FIG. 34 is a diagram showing the configuration of a variation of the eighth embodiment of the invention.

FIG. 34 is a diagram showing the configuration of a variation of the eighth embodiment. In FIG. 34, the configuration of a one-bit output buffer included in output circuit 182 is shown. In FIG. 34, the output buffer includes an NAND circuit 190 including internal read data iDj and output buffer enable signal OE, and a p channel MOS transistor 192 conducting with the output signal of NAND circuit 190 being at an L level to output an H level signal to output node 185. Output node 185 is provided with a pull-down resistor Rd. In the configuration shown in FIG. 30, if valid data is not output, in other words, output buffer enable signal OE is at an L level, the output signal of NAND circuit 190 is at an H level, MOS transistor 192 is in a non-conduction state, and output node 185 is driven to an L level.

Meanwhile, if output buffer enable signal OE is pulled to an H level and valid data is output, NAND circuit 190 functions as an inverter, and if internal read data iDj is at an L level, MOS transistor 192 is brought into an non-conduction state, and L level data Dj is output. Meanwhile if internal read data iDj is at an H level, the output signal of NAND circuit 190 attains an L level, MOS transistor 192 conducts, and data Dj from output node 185 attains an H level.

In the configuration shown in FIG. 30, data output node 185 is driven to an L level in a stand-by state (when valid data is not output), while at the time of outputting valid data, the node is driven to a potential level corresponding to internal read data. If among 9-bit data D0 to D8, there exits an odd number of L level data bits, a parity error is determined as a result. Data bits D0 to D8 are all at an L level in a stand-by state (if valid data is not output), and the number of pieces of L level data bits is an odd number in a parity error state. The processor monitors this state and determines that valid data is not output.

In the eight embodiment, any of configurations shown in FIGS. 32 and 34 may be used depending on a method of determining a parity error in a processing system to be used.

According to the eighth embodiment, if a parity bit is included, these data bits are all kept in a state in which a parity error is present in a stand-by state (when valid data is not output), therefore no excess valid/invalid instruction circuit is necessary, and the externally provided processor can be surely notified of the timing in which valid data is output, without increasing the number of data output nodes (terminals).

[Other applications]

In the foregoing, the clock synchronous type the semiconductor memory devices as well as the multi-bank type DRAMs are described. However, the configuration for notifying an external device of a state in which valid data is output may be aplied in a standard DRAM. In such a case, the configuration in which the output buffer enable signal OE is externally output may be employed.

As described above, according to the present invention, in a semiconductor memory device in which a plurality of banks share a sense amplifier, connection between local input/output bus and a global input/output bus is controlled in response to a control signal from a column selecting circuitry, and therefore, data of a plurality of banks will not be read out at time on an internal read data line, so that writing/reading out necessary data can be accurately conducted.

In addition, if there is a confliction for a sense amplifier band, one memory block (bank) is brought into an inactive state, then the other memory block is driven to an activate state, data can be prevented from colliding in the sense amplifier band, and therefore accurate sensing/amplification of data can be executed.

Furthermore, by the internal automatic precharge operation, if the time of outputting data changes from a predetermined output latency a valid data output timing is notified by outputting a data valid data signal or using a parity bit, and therefore an external processor can readily recognize that the valid data is output, so that the data processor can surely take in necessary data even if there is a confliction to a sense amplifier band.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory array having a plurality of memory blocks each having a plurality of memory cells arranged in rows and columns and aligned along the columns;

a plurality of sense amplifier bands provided between adjacent memory blocks in said memory array and selectively connected with one of the adjacent memory blocks for sensing and amplifying memory cell data on a column in a corresponding memory block;

a plurality of block isolation/connection means provided between said memory blocks and said plurality of sense amplifier bands for connecting each column in a corresponding memory block to a corresponding sense amplifier band when activated;

isolation/connection control means responsive to a bank address signal specifying a memory block in said memory array for inactivating block isolation/connection means provided in a memory block sharing a sense amplifier band with the addressed memory block;

sense activation control means provided corresponding to each of said plurality of sense amplifier bands and responsive to said bank address signal and a sense activation signal for activating a sense amplifier band provided to said addressed memory block, said sense activation control means including, (a) storage means for storing bank address data to specify a memory block which has most recently used the sense amplifier band, and (b) determination means for determining the coincidence or incoincidence of the bank address data stored by said storage means and said bank address signal;

inactivation means for inactivating a corresponding sense amplifier band in response to an activation of an array driving activation signal if said determination means indicates incoincidence; and array driving means provided corresponding to each of said memory blocks and responsive to said bank address signal, a row address signal for specifying a row and said array driving activation signal, for driving a row in a corresponding memory block to a selected state and activating said sense activation signal for application to corresponding sense activation control means, wherein said array driving means and said block isolation/ connection means includes isolation means responsive to the inactivation of said corresponding sense amplifier band by said inactivation means for driving a corresponding memory block to an inactivate state and isolating the corresponding memory block from said corresponding sense amplifier band.

2. The semiconductor memory device as recited in claim 1, wherein said array driving means each include means for driving said addressed memory block into an active state according to said array driving activation signal after the elapse of a prescribed time period in response to the inactivation of said corresponding sense amplifier band by said inactivation means.

3. The semiconductor memory device as recited in claim 1, further comprising means for externally outputting a signal prohibiting an external operation mode instruction signal from being input for a prescribed time period in response to the inactivation of the corresponding sense amplifier band by said inactivation means.

4. The semiconductor memory device as recited in claim 1, further comprising reading/outputting means responsive to a read operation instruction signal and an address signal simultaneously applied with the read operation instruction signal for reading out data amplified by said corresponding sense amplifier band, and externally outputting the data, and data valid signal outputting means responsive to said read operation instruction signal and the inactivation of said corresponding sense amplifier band for externally outputting a data valid signal indicating the output of valid data from said reading/outputting means.

5. The semiconductor memory device as recited in claim 4, wherein said data valid signal outputting means includes means for maintaining said data valid signal at a first level when said semiconductor memory device is in a stand-by state, and driving said data valid signal to a second level different from said first level, when valid data is output from said reading/outputting means.

6. The semiconductor memory device as recited in claim 4, wherein said semiconductor memory device operates in synchronization with a clock signal, and said data valid signal outputting means includes means for activating said data valid signal in a clock cycle before a clock cycle in which valid data is output from said reading/ outputting means.

7. The semiconductor memory device as recited in claim 4, wherein said data valid signal outputting means includes means for maintaining said data valid signal in an active state during the period in which valid data is output from said reading/outputting means.

8. The semiconductor memory device as recited in claim 4, wherein said data valid signal outputting means includes means for outputting said data valid signal in the form of a one shot pulse having a constant pulse width defined independently from a time period in which said valid data is output from said reading/outputting means.

9. The semiconductor memory device as recited in claim 4, further comprising parity bit storage means for storing a parity bit to correct an error of data, wherein said reading/outputting means includes means for maintaining a data output node at a first level during inactivation;

said data valid signal outputting means includes means activated simultaneously with said reading/outputting means for outputting a parity bit read out from said parity bit storage means, and means for maintaining an output node thereof at the time of a stand-by state at a level indicating the presence of a parity error in data output from the reading/outputting means.

* * * * *